(12) United States Patent
An et al.

(10) Patent No.: US 12,218,701 B2
(45) Date of Patent: Feb. 4, 2025

(54) METHOD FOR MAINTAINING PERFORMANCE OF TRANSMISSION SIGNAL, AND ELECTRONIC DEVICE FOR PERFORMING SAME

(71) Applicant: SAMSUNG ELECTRONICS CO., LTD., Suwon-si (KR)

(72) Inventors: Yongjun An, Suwon-si (KR); Namjun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 325 days.

(21) Appl. No.: 17/673,102

(22) Filed: Feb. 16, 2022

(65) Prior Publication Data

US 2022/0173762 A1 Jun. 2, 2022

Related U.S. Application Data

(63) Continuation of application No. PCT/KR2020/010846, filed on Aug. 14, 2020.

(30) Foreign Application Priority Data

Aug. 20, 2019 (KR) .................. 10-2019-0101756

(51) Int. Cl.
*H04B 1/40* (2015.01)
*H03F 3/19* (2006.01)
(Continued)

(52) U.S. Cl.
CPC ............. *H04B 1/40* (2013.01); *H03F 3/19* (2013.01); *H03F 3/21* (2013.01); *H04B 1/10* (2013.01);
(Continued)

(58) Field of Classification Search
CPC ............ H04B 1/40; H04B 1/10; H04B 17/12; H04B 2001/0416; H04B 17/354;
(Continued)

(56) References Cited

U.S. PATENT DOCUMENTS 6,311,075 B1 * 10/2001 Bevan ................... H01Q 21/29
342/368
6,438,360 B1 8/2002 Alberth, Jr. et al.
(Continued)

FOREIGN PATENT DOCUMENTS

| KR | 10-1428897 | 8/2014 |
|---|---|---|
| KR | 10-2015-0127949 | 11/2015 |
| KR | 10-2017-0012128 | 2/2017 |

OTHER PUBLICATIONS

International Search Report for PCT/KR2020/010846 dated Nov. 27, 2020, 6 pages.
(Continued)

*Primary Examiner* — Mazda Sabouri
(74) *Attorney, Agent, or Firm* — Nixon & Vanderhye P.C.

(57) ABSTRACT

According to various embodiments of the present disclosure, an electronic device may comprise: a transceiver; a power amplifier connected to the transceiver; a power source modulator configured to supply power to the power amplifier; at least one antenna connected to the power amplifier; and at least one processor operably connected to the transceiver, the power amplifier; and the power source modulator. The at least one processor may confirm whether the state of an uplink signal transmitted through the at least one antenna is a first state, and may control the power source modulator to add a first offset value to a voltage value of power supplied to the power amplifier from the power source modulator, based on the state of a downlink signal received to the transceiver being the first state.

16 Claims, 11 Drawing Sheets

(51) Int. Cl.
   *H03F 3/21*    (2006.01)
   *H04B 1/04*    (2006.01)
   *H04B 1/10*    (2006.01)
   *H04B 17/12*   (2015.01)

(52) U.S. Cl.
   CPC ....... *H04B 17/12* (2015.01); *H03F 2200/294* (2013.01); *H04B 2001/0416* (2013.01)

(58) Field of Classification Search
   CPC ........... H04B 1/04; H04B 17/318; H03F 3/19; H03F 3/21; H03F 2200/294; H03F 2200/102; H03F 2200/204; H03F 2200/451; H03F 1/0227; H03F 3/195; H03F 3/245; H04L 1/18

See application file for complete search history.

(56) References Cited

U.S. PATENT DOCUMENTS

| | | | |
|---|---|---|---|
| 8,165,642 | B2 | 4/2012 | Dimpflmaier et al. |
| 9,369,161 | B1 | 6/2016 | Chukka et al. |
| 9,420,395 | B1* | 8/2016 | Khlat .................... H04W 52/12 |
| 9,585,068 | B2* | 2/2017 | Tabet .............. H04W 36/00837 |
| 9,629,108 | B2 | 4/2017 | Song et al. |
| 2009/0003272 | A1 | 1/2009 | Payne et al. |
| 2011/0143805 | A1 | 6/2011 | Ramasamy et al. |
| 2013/0195219 | A1 | 8/2013 | Vinayagamoorthy et al. |
| 2013/0329570 | A1 | 12/2013 | Wang et al. |
| 2015/0326258 | A1* | 11/2015 | Song ........................ H04L 1/20 455/127.2 |
| 2018/0331662 | A1 | 11/2018 | Maa et al. |

OTHER PUBLICATIONS

Written Opinion of the ISA for PCT/KR2020/010846 dated Nov. 27, 2020, 6 pages.

* cited by examiner

METHOD FOR MAINTAINING PERFORMANCE OF TRANSMISSION SIGNAL, AND ELECTRONIC DEVICE FOR PERFORMING SAME

CROSS-REFERENCE TO RELATED APPLICATIONS

This application is a continuation of International Application No. PCT/KR2020/010846 designating the United States, filed on Aug. 14, 2020, in the Korean Intellectual Property Office and claiming priority to Korean Patent Application No. 10-2019-0101756, filed on Aug. 20, 2019, in the Korean Intellectual Property Office, the disclosures of which are incorporated by reference herein in their entireties.

BACKGROUND

Field

The disclosure relates to a method for maintaining the performance of a transmission signal and an electronic device for performing the same.

Description of Related Art

An electronic device may receive or transmit a signal wirelessly using an antenna. A communication processor (CP) of the electronic device may perform a wireless communication function with another electronic device (e.g., a base station, a network, and/or other terminal) through the antenna. When performing the wireless communication function, the electronic device may amplify a signal using an amplification module (e.g., a power amplifier (PA) or a low noise amplifier (LNA)). For example, in case of transmitting a radio frequency (RF) signal (e.g., a Tx signal), a transceiver of the electronic device may transmit the Tx signal to the PA to amplify the Tx signal. The amplified Tx signal may be transmitted to another electronic device through the antenna. In case of receiving an RF signal (e.g., an Rx signal), the Rx signal may be received through the antenna and amplified through the LNA. The transceiver of the electronic device may receive the amplified Rx signal.

The electronic device may perform wireless communication with another external electronic device and may transmit/receive RF signals. A wireless communication circuit may include the power amplifier (PA) at a transmitting end and include the low noise amplifier (LNA) at a receiving end. When an RF signal is transmitted through the antenna, the RF signal may be reflected by objects (e.g., things and other antennas) located in the vicinity of the antenna, and the reflected wave may be input to an output port of the PA. In implementation, when the electronic device transmits an RF signal, the linearity of the RF signal may be deteriorated due to the reflected wave, and the signal quality of the RF signal may be degraded.

SUMMARY

Embodiments of the disclosure provide an electronic device that may identify the signal quality degradation of an RF signal (e.g., Tx signal) and adjust the magnitude of a voltage supplied to a power amplifier, thereby maintaining the signal quality of the RF signal.

According to various example embodiments of the disclosure, an electronic device may include: a transceiver, a power amplifier (PA) connected to the transceiver, a power supply modulator configured to supply power to the power amplifier, at least one antenna connected to the power amplifier, and at least one processor operatively connected to the transceiver, the power amplifier, and the power supply modulator. The at least one processor may be configured to: determine whether a state of an uplink signal transmitted through the at least one antenna is a first state, determine whether a state of a downlink signal received to the transceiver is the first state, and control the power supply modulator to add a first offset value to a voltage value of power supplied from the power supply modulator to the power amplifier based on the state of the uplink signal being the first state and the state of the downlink signal being the first state.

According to various example embodiments of the disclosure, an electronic device may include: a transceiver, a power amplifier (PA) connected to the transceiver, a power supply modulator configured to supply power to the power amplifier, at least one antenna connected to the power amplifier, a tuner disposed between the power amplifier and the at least one antenna, and at least one processor operatively connected to the transceiver, the power amplifier, the power supply modulator, and the tuner. The at least one processor may be configured to: determine whether a state of an uplink signal transmitted through the at least one antenna is a first state, determine whether a state of a downlink signal received to the transceiver is the first state, and based on the state of the uplink signal being the first state and the state of the downlink signal being the first state, check whether the state of the uplink signal is adjustable to a second state using the tuner, and control the tuner to adjust the state of the uplink signal to the second state in response to being adjustable.

According to various example embodiments of the disclosure, a method may include: determining whether a state of an uplink signal transmitted through at least one antenna of an electronic device is a first state, determining whether a state of a downlink signal received to a transceiver of the electronic device is the first state, and adding a first offset value to a voltage value of power supplied from a power supply modulator of the electronic device to a power amplifier of the electronic device based on the state of the uplink signal being the first state and the state of the downlink signal being the first state.

Various example embodiments of the disclosure can provide the electronic device in which the signal quality of an RF signal is maintained by adjusting a voltage value of power supplied to the power amplifier (PA). According to various embodiments, in a state where the signal quality of a downlink (DL) signal (Rx signal) is good, it is possible to identify the signal quality degradation of an uplink (UL) signal (Tx signal), based on a block error rate (BLER) or an adjacent channel leakage ratio (ACLR) for the UL signal (Tx signal).

The electronic device according to various example embodiments can maintain the signal quality of the uplink signal (Tx signal) by identifying the signal quality degradation of the uplink signal (Tx signal) and adjusting the voltage value of power supplied to the PA from the power supply modulator. In addition, various effects explicitly or implicitly appreciated through the disclosure may be provided.

BRIEF DESCRIPTION OF THE DRAWINGS

In connection with the description of the drawings, the same or similar reference numerals may be used for the same or similar components. Further, the above and other aspects, features and advantages of certain embodiments of the present disclosure will be more apparent from the following detailed description, taken in conjunction with the accompanying drawings, in which.

DETAILED DESCRIPTION

Figure 1:
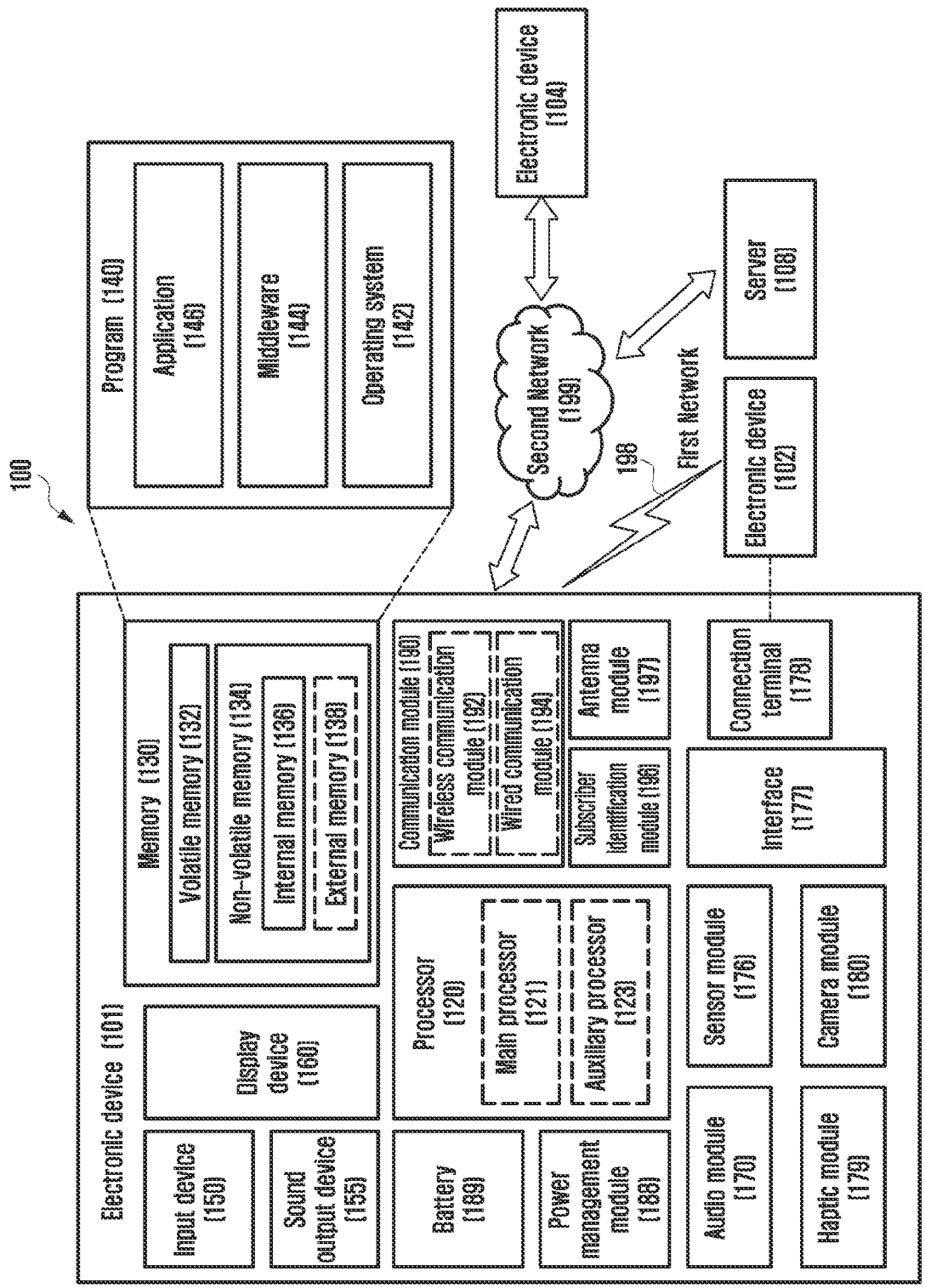
FIG. 1 is a block diagram illustrating an example electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In various embodiments, at least one (e.g., the display device 160 or the camera module 180) of the components may be omitted from the electronic device 101, or one or more other components may be added in the electronic device 101. In various embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 (e.g., DRAM, SRAM or SDRAM) may include the volatile memory 132 or the non-volatile memory 134.

The program 140 may be stored in the memory 130 as software, and may include, for example, an operating system (OS) 142, middleware 144, or an application 146 (e.g., application program).

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, a home appliance, or the like. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

The term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
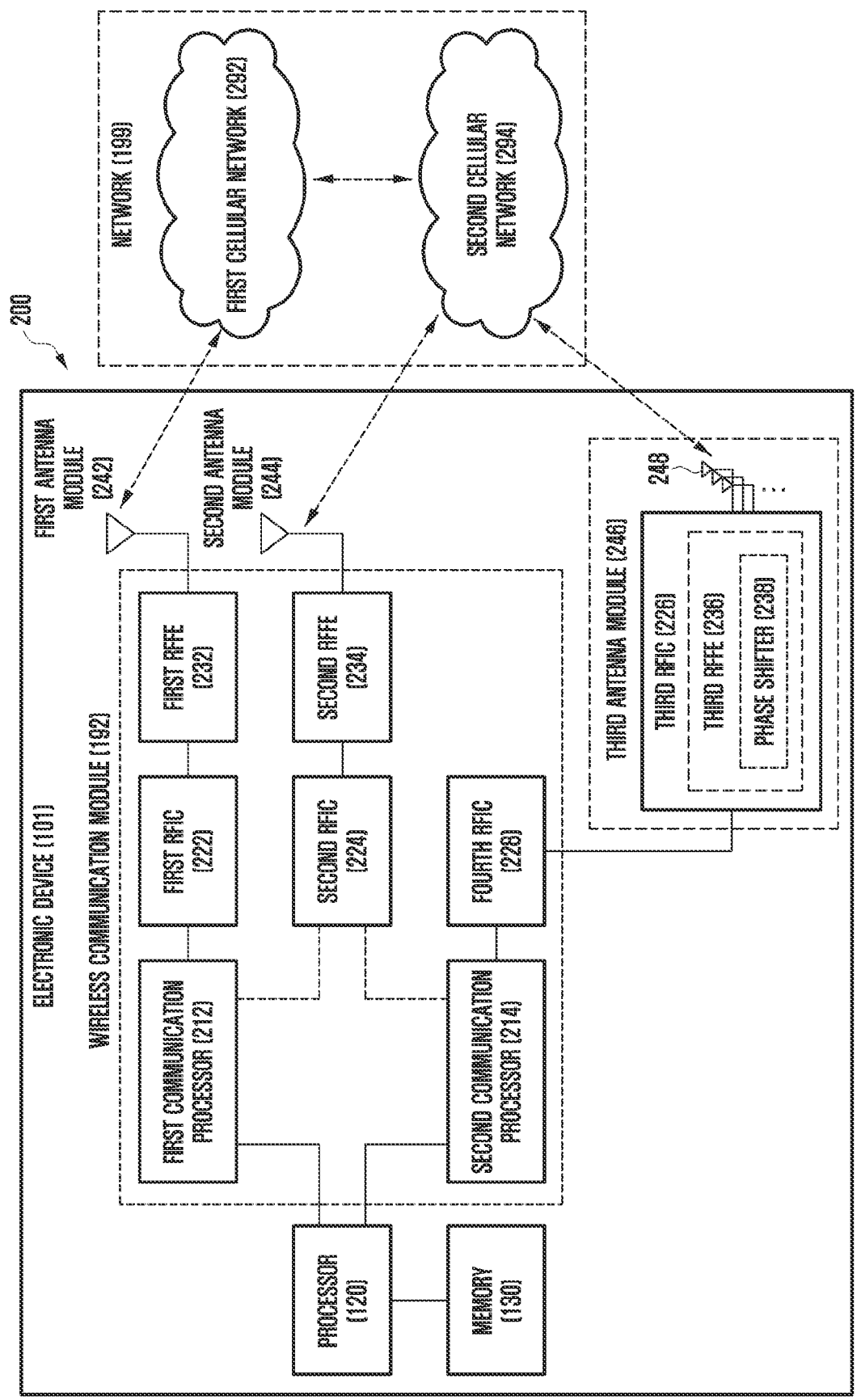
FIG. 2 is a block diagram illustrating an example configuration of an electronic device for supporting legacy network communication and 5G network communication according to various embodiments.

FIG. 2 is a block diagram 200 illustrating an example configuration of the electronic device 101 for supporting legacy network communication and 5G network communication according to various embodiments.

Referring to FIG. 2, the electronic device 101 may include a first communication processor (e.g., including processing circuitry) 212, second communication processor (e.g., including processing circuitry) 214, first RFIC 222, second RFIC 224, third RFIC 226, fourth RFIC 228, first radio frequency front end (RFFE) 232, second RFFE 234, first antenna module 242, second antenna module 244, and antenna 248. The electronic device 101 may include a processor 120 and a memory 130. A second network 199 may include a first cellular network 292 and a second cellular network 294. According to another embodiment, the electronic device 101 may further include at least one of the components described with reference to FIG. 1, and the second network 199 may further include at least one other network. According to an embodiment, the first communication processor 212, second communication processor 214, first RFIC 222, second RFIC 224, fourth RFIC 228, first RFFE 232, and second RFFE 234 may form at least part of the wireless communication module 192. According to another embodiment, the fourth RFIC 228 may be omitted or included as part of the third RFIC 226.

The first communication processor 212 may include various processing circuitry and establish a communication channel of a band to be used for wireless communication with the first cellular network 292 and support legacy network communication through the established communication channel. According to various embodiments, the first cellular network may be a legacy network including a second generation (2G), 3G, 4G, or long term evolution (LTE) network. The second communication processor 214 may establish a communication channel corresponding to a designated band (e.g., about 6 GHz to about 60 GHz) of bands to be used for wireless communication with the second cellular network 294, and support 5G network communication through the established communication channel. According to various embodiments, the second cellular network 294 may be a 5G network defined in 3GPP. Additionally, according to an embodiment, the first communication processor 212 or the second communication processor 214 may include various processing circuitry and establish a communication channel corresponding to another designated band (e.g., about 6 GHz or less) of bands to be used for wireless communication with the second cellular network 294 and support 5G network communication through the established communication channel. According to an embodiment, the first communication processor 212 and the second communication processor 214 may be implemented in a single chip or a single package. According to various embodiments, the first communication processor 212 or the second communication processor 214 may be formed in a single chip or a single package with the processor 120, the auxiliary processor 123, or the communication module 190.

Upon transmission, the first RFIC 222 may convert a baseband signal generated by the first communication processor 212 to a radio frequency (RF) signal of about 700 MHz to about 3 GHz used in the first cellular network 292 (e.g., legacy network). Upon reception, an RF signal may be obtained from the first cellular network 292 (e.g., legacy network) through an antenna (e.g., the first antenna module 242) and be preprocessed through an RFFE (e.g., the first RFFE 232). The first RFIC 222 may convert the preprocessed RF signal to a baseband signal so as to be processed by the first communication processor 212.

Upon transmission, the second RFIC 224 may convert a baseband signal generated by the first communication processor 212 or the second communication processor 214 to an RF signal (hereinafter, 5G Sub6 RF signal) of a Sub6 band (e.g., 6 GHz or less) to be used in the second cellular network 294 (e.g., 5G network). Upon reception, a 5G Sub6 RF signal may be obtained from the second cellular network 294 (e.g., 5G network) through an antenna (e.g., the second antenna module 244) and be pretreated through an RFFE (e.g., the second RFFE 234). The second RFIC 224 may convert the preprocessed 5G Sub6 RF signal to a baseband signal so as to be processed by a corresponding communication processor of the first communication processor 212 or the second communication processor 214.

The third RFIC 226 may convert a baseband signal generated by the second communication processor 214 to an RF signal (hereinafter, 5G Above6 RF signal) of a 5G Above6 band (e.g., about 6 GHz to about 60 GHz) to be used in the second cellular network 294 (e.g., 5G network). Upon reception, a 5G Above6 RF signal may be obtained from the second cellular network 294 (e.g., 5G network) through an antenna (e.g., the antenna 248) and be preprocessed through the third RFFE 236. The third RFIC 226 may convert the preprocessed 5G Above6 RF signal to a baseband signal so as to be processed by the second communication processor 214. According to an embodiment, the third RFFE 236 may be formed as part of the third RFIC 226.

According to an embodiment, the electronic device 101 may include a fourth RFIC 228 separately from the third RFIC 226 or as at least part of the third RFIC 226. In this case, the fourth RFIC 228 may convert a baseband signal generated by the second communication processor 214 to an RF signal (hereinafter, an intermediate frequency (IF) signal) of an intermediate frequency band (e.g., about 9 GHz to about 11 GHz) and transfer the IF signal to the third RFIC 226. The third RFIC 226 may convert the IF signal to a 5G Above 6RF signal. Upon reception, the 5G Above6RF signal may be received from the second cellular network 294 (e.g., a 5G network) through an antenna (e.g., the antenna 248) and be converted to an IF signal by the third RFIC 226. The fourth RFIC 228 may convert an IF signal to a baseband signal so as to be processed by the second communication processor 214.

According to an embodiment, the first RFIC 222 and the second RFIC 224 may be implemented into at least part of a single package or a single chip. According to an embodiment, the first RFFE 232 and the second RFFE 234 may be implemented into at least part of a single package or a single chip. According to an embodiment, at least one of the first antenna module 242 or the second antenna module 244 may be omitted or may be combined with another antenna module to process RF signals of a corresponding plurality of bands.

According to an embodiment, the third RFIC 226 and the antenna 248 may be disposed at the same substrate to form a third antenna module 246. For example, the wireless communication module 192 or the processor 120 may be disposed at a first substrate (e.g., main PCB). In this case, the third RFIC 226 is disposed in a partial area (e.g., lower surface) of the first substrate and a separate second substrate (e.g., sub PCB), and the antenna 248 is disposed in another partial area (e.g., upper surface) thereof; thus, the third antenna module 246 may be formed. By disposing the third RFIC 226 and the antenna 248 in the same substrate, a length of a transmission line therebetween can be reduced. This may reduce, for example, a loss (e.g., attenuation) of a signal of a high frequency band (e.g., about 6 GHz to about 60 GHz) to be used in 5G network communication by a transmission line. Therefore, the electronic device 101 may improve a quality or speed of communication with the second cellular network 294 (e.g., 5G network).

According to an embodiment, the antenna 248 may be formed in an antenna array including a plurality of antenna elements that may be used for beamforming. In this case, the third RFIC 226 may include a plurality of phase shifters 238 corresponding to a plurality of antenna elements, for example, as part of the third RFFE 236. Upon transmission, each of the plurality of phase shifters 238 may convert a phase of a 5G Above6 RF signal to be transmitted to the outside (e.g., a base station of a 5G network) of the electronic device 101 through a corresponding antenna element. Upon reception, each of the plurality of phase shifters 238 may convert a phase of the 5G Above6 RF signal received from the outside to the same phase or substantially the same phase through a corresponding antenna element. This enables transmission or reception through beamforming between the electronic device 101 and the outside.

The second cellular network 294 (e.g., 5G network) may operate (e.g., stand-alone (SA)) independently of the first cellular network 292 (e.g., legacy network) or may be operated (e.g., non-stand-alone (NSA)) in connection with the first cellular network 292. For example, the 5G network may have only an access network (e.g., 5G radio access network (RAN) or a next generation (NG) RAN and have no core network (e.g., next generation core (NGC)). In this case, after accessing to the access network of the 5G network, the electronic device 101 may access to an external network (e.g., Internet) under the control of a core network (e.g., an evolved packed core (EPC)) of the legacy network.

Protocol information (e.g., LTE protocol information) for communication with a legacy network or protocol information (e.g., new radio (NR) protocol information) for communication with a 5G network may be stored in the memory 130 to be accessed by other components (e.g., the processor 120, the first communication processor 212, or the second communication processor 214).

Figure 3A:
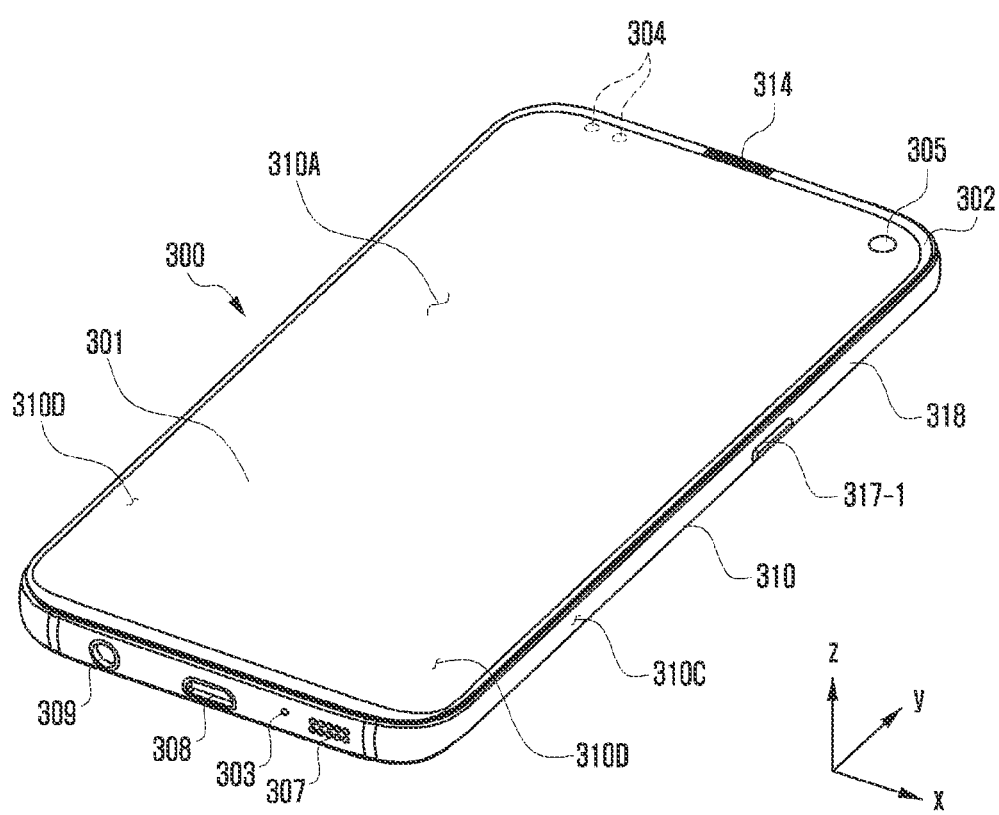
FIG. 3A is a front perspective view illustrating a mobile electronic device according to various embodiments.
Figure 3B:
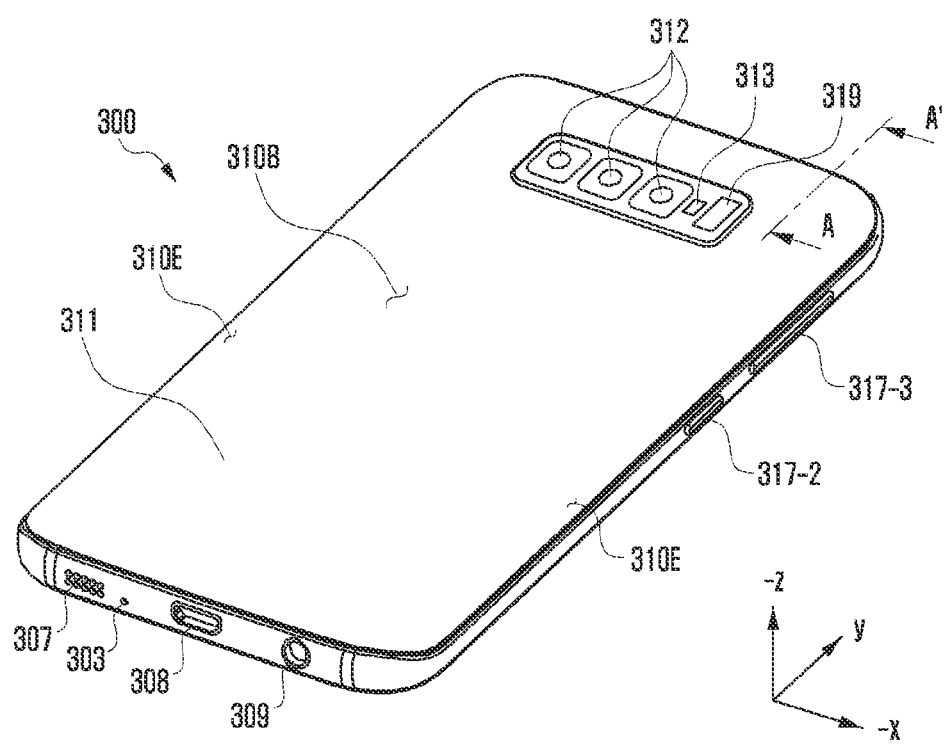
FIG. 3B is a rear perspective view illustrating a mobile electronic device according to various embodiments.

FIG. 3A is a front perspective view illustrating a mobile electronic device 300 according to various embodiments. FIG. 3B is a rear perspective view illustrating a mobile electronic device 300 according to various embodiments.

The electronic device 300 of FIGS. 3A and 3B may include at least some embodiments similar to or different from the electronic device 101 of FIG. 1.

Referring to FIGS. 3A and 3B, the mobile electronic device 300 (e.g., the electronic device 101 of FIG. 1) according to various embodiments may include a housing 310 including a first surface (or front surface) 310A, a second surface (or rear surface) 310B, and a side surface 310C enclosing a space between the first surface 310A and the second surface 310B. In an embodiment (not illustrated), the housing may refer to a structure forming some of the first surface 310A, the second surface 310B, and the side surface 310C. According to an embodiment, the first surface 310A may be formed by an at least partially substantially transparent front plate 302 (e.g., a polymer plate or a glass plate including various coating layers). The second surface 310B may be formed by a substantially opaque rear plate 311. The rear plate 311 may be formed by, for example, coated or colored glass, ceramic, polymer, metal (e.g., aluminum, stainless steel (STS), or magnesium), or a combination of at least two of the above materials. The side surface 310C may be coupled to the front plate 302 and the rear plate 311 and be formed by a side bezel structure (or "side member") 318 including a metal and/or a polymer. In various embodiments, the rear plate 311 and the side bezel structure 318 may be integrally formed and include the same material (e.g., metal material such as aluminum).

In the illustrated embodiment, the front plate 302 may include two first regions 310D bent and extended seamlessly from the first surface 310A toward the rear plate 311 at both ends of a long edge of the front plate 302. In the illustrated embodiment (see FIG. 3B), the rear plate 311 may include two second regions 310E bent and extended seamlessly from the second surface 310B towards the front plate 302 at both ends of a long edge. In various embodiments, the front plate 302 (or the rear plate 311) may include only one of the first regions 310D (or the second regions 310E). In an embodiment, a portion of the first regions 310D or the second regions 310E may not be included. In the above embodiments, when viewed from the side surface of the mobile electronic device 300, the side bezel structure 318 may have a first thickness (or width) at a side surface in which the first region 310D or the second region 310E is not included and have a second thickness less than the first thickness at a side surface including the first region 310D or the second region 310E.

In an embodiment, the electronic device 300 may include at least one of a display 301, an input device 303, sound output devices 307 and 314, sensor modules 304 and 319, camera modules 305, 312 and 313, key input devices 317-1, 317-2 and 317-3, an indicator (not shown), or connectors 308 and 309. In a certain embodiment, at least one of the components of the electronic device 300 (e.g., key input devices 317-1, 317-2 and 317-3, or indicator) may be omitted, or a different component may be added to the electronic device 300.

The display 301 may be exposed through, for example, a substantial portion of the front plate 302. In various embodiments, at least part of the display 301 may be exposed through the front plate 302 forming the first region 310D of the side surface 310C and the first surface 310A. The display 301 may be coupled to or disposed adjacent to a touch detection circuit, a pressure sensor capable of measuring intensity (pressure) of the touch, and/or a digitizer for detecting a stylus pen of a magnetic field method. In various embodiments, at least part of the sensor modules 304 and 319 and/or at least part of the key input device 317-1, 317-2, and 317-3 may be disposed in a first region 310D and/or a second region 310E.

The input device 303 may include a microphone 303. In a certain embodiment, the input device 303 may include a plurality of microphones 303 arranged to sense the direction of a sound. The sound output devices 307 and 314 may include speakers 307 and 314. The speakers 307 and 314 may include an external speaker 307 and a receiver 314 for a call. In a certain embodiment, the microphone 303, the speakers 307 and 314, and the connectors 308 and 309 may be disposed in the space of the electronic device 300 and may be exposed to the external environment through at least one hole formed in the housing 310. In a certain embodiment, the hole formed in the housing 310 may be used commonly for the microphone 303 and the speakers 307 and 314. In a certain embodiment, the sound output devices 307 and 314 may include a speaker (e.g., piezo speaker) operating without using the hole formed in the housing 310.

The sensor modules 304 and 319 may generate an electrical signal or a data value corresponding to an operating state inside the mobile electronic device 300 or an environment state outside the mobile electronic device 300. The sensor modules 304 and 319 may include, for example, a first sensor module 304 (e.g., proximity sensor) and/or a second sensor module (not illustrated) (e.g., fingerprint sensor), disposed at the first surface 310A of the housing 310, and/or a third sensor module 319 (e.g., a heart rate monitor (HRM) sensor) and/or a fourth sensor module 316 (e.g., fingerprint sensor), disposed at the second surface 310B of the housing 310. The fingerprint sensor may be disposed at the second surface 310B as well as the first surface 310A (e.g., the display 301) of the housing 310. The mobile electronic device 300 may further include a sensor module (not illustrated), for example, at least one of a gesture sensor, gyro sensor, air pressure sensor, magnetic sensor, acceleration sensor, grip sensor, color sensor, IR sensor, biometric sensor, temperature sensor, humidity sensor, and illumination sensor 304.

The camera modules 305, 312, and 313 may include a first camera device 305 disposed at the first surface 310A of the mobile electronic device 300, a second camera device 312 disposed at the second surface 310B thereof, and/or a flash 313. The camera modules 305 and 312 may include one or a plurality of lenses, an image sensor, and/or an image signal processor. The flash 313 may include, for example, a light emitting diode or a xenon lamp. In various embodiments, two or more lenses (infrared camera, wide angle and telephoto lens) and image sensors may be disposed at one surface of the mobile electronic device 300.

The key input device 317-1, 317-2, and 317-3 may be disposed at the side surface 310C of the housing 310. In an embodiment, the mobile electronic device 300 may not include some or all of the above-described key input devices 317-1, 317-2, and 317-3, and the key input device 317-1, 317-2, and 317-3 that is not included may be implemented in other forms such as a soft key on the display 301. In various embodiments, the key input device 317-1, 317-2, and 317-3 may include a sensor module 316 disposed at the second surface 310B of the housing 310.

The indicator may be disposed at, for example, the first surface 310A of the housing 310. The indicator may provide, for example, status information of the mobile electronic device 300 in an optical form. In an embodiment, the indicator may provide, for example, a light source interworking with an operation of the camera module 305. The indicator may include, for example, a light emitting diode (LED), an IR LED, and a xenon lamp.

The connector ports 308 and 309 may include a first connector port 308 that may receive a connector (e.g., a USB connector) for transmitting and receiving power and/or data to and from an external electronic device and/or a second connector hole (e.g., earphone jack) 309 that can receive a connector for transmitting and receiving audio signals to and from an external electronic device.

The camera module 305 of the camera modules 305 and 312, the sensor module 304 of the sensor modules 304 and 319, or the indicator may be arranged to be exposed through the display 301. For example, the camera module 305, the sensor module 304, or the indicator may be arranged in the internal space of the electronic device 300 so as to contact the external environment through an opening perforated up to the display 301 and the front plate 302. In another embodiment, one sensor module (e.g., sensor module 304) may be disposed in the internal space of the electronic device so as to perform its functions without being visually exposed through the front plate 302. In this case, the perforated opening may be not required for the region of the display 301 facing the sensor module.

Figure 3C:
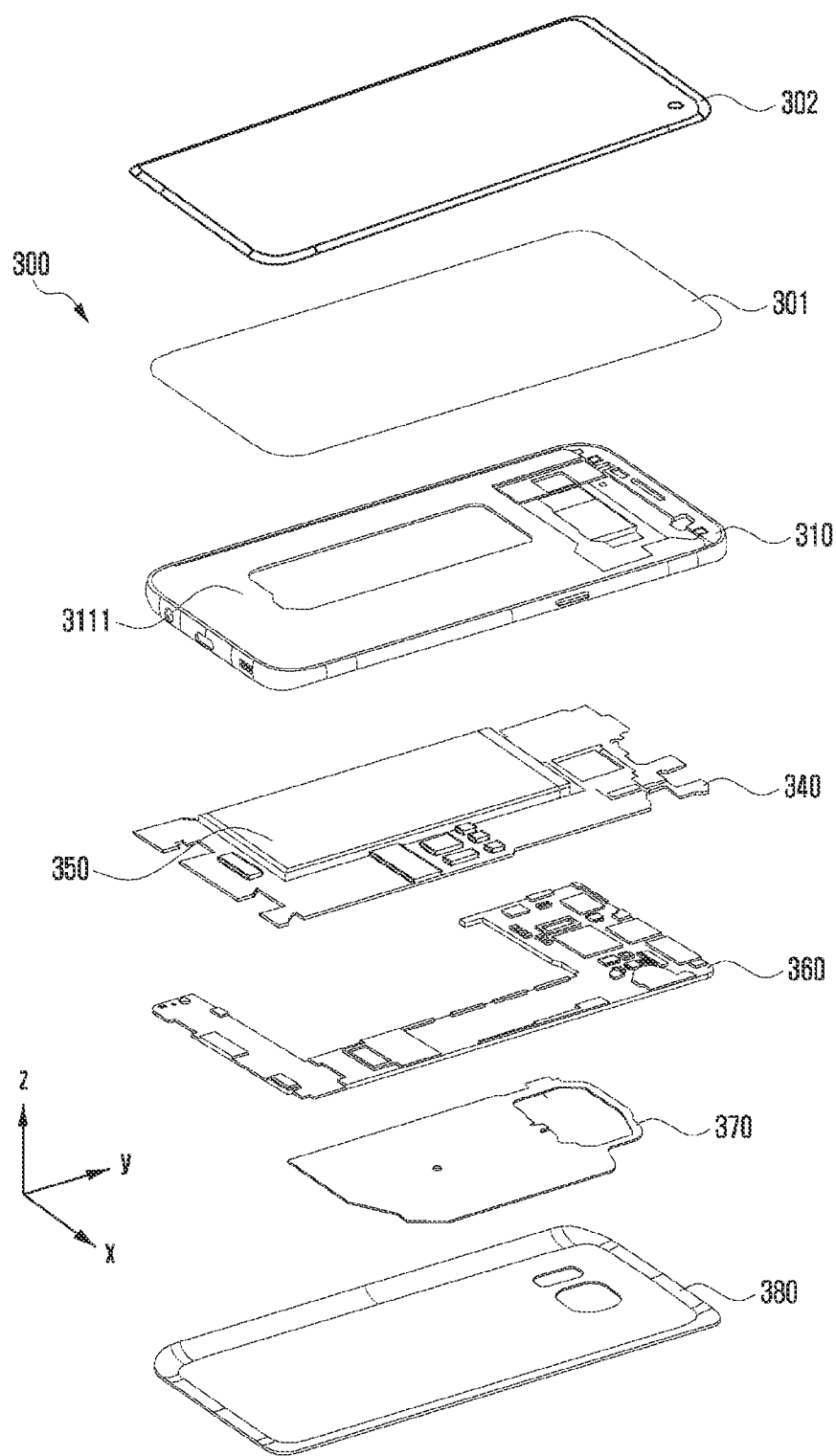
FIG. 3C is an exploded perspective view illustrating a mobile electronic device according to various embodiments.

FIG. 3C is an exploded perspective view illustrating a mobile electronic device according to various embodiments.

Referring to FIG. 3C, the mobile electronic device 300 (e.g., the mobile electronic device 300 of FIG. 3A) may include a side bezel structure 310, first support member 3111 (e.g., bracket), front plate 302, display 301, printed circuit board 340, battery 350, second support member 360 (e.g., rear case), antenna 370, and rear plate 380. In various embodiments, the electronic device 300 may omit at least one (e.g., the first support member 3111 or the second support member 360) of the components or may further include other components. At least one of the components of the electronic device 300 may be the same as or similar to at least one of the components of the mobile electronic device 300 of FIG. 3A or 3B and a duplicated description is omitted below.

The first support member 3111 may be disposed inside the electronic device 300 to be connected to the side bezel structure 310 or may be integrally formed with the side bezel structure 310. The first support member 3111 may be made of, for example, a metal material and/or a non-metal (e.g., polymer) material. In the first support member 3111, the display 301 may be coupled to one surface thereof, and the printed circuit board 340 may be coupled to the other surface thereof. In the printed circuit board 340, a processor, a memory, and/or an interface may be mounted. The processor may include, for example, one or more of a central processing unit, application processor, graphic processing unit, image signal processor, sensor hub processor, or communication processor.

The memory may include, for example, a volatile memory or a nonvolatile memory.

The interface may include, for example, a HDMI, USB interface, SD card interface, and/or audio interface. The interface may, for example, electrically or physically connect the electronic device 320 to an external electronic device and include a USB connector, an SD card/multimedia card (MMC) connector, or an audio connector.

The battery 350 is a device for supplying power to at least one component of the electronic device 300 and may include, for example, a non-rechargeable primary battery, a rechargeable secondary battery, or a fuel cell. At least part of the battery 350 may be disposed, for example, on substantially the same plane as that of the printed circuit board 340. The battery 350 may be integrally disposed inside the electronic device 300 or may be detachably disposed in the electronic device 300.

The antenna 370 may be disposed between the rear plate 380 and the battery 350. The antenna 370 may include, for example, a near field communication (NFC) antenna, wireless charging antenna, and/or magnetic secure transmission (MST) antenna. The antenna 370 may perform, for example, short range communication with an external device or may wirelessly transmit and receive power required for charging. In an embodiment, an antenna structure may be formed by some or a combination of the side bezel structure 310 and/or the first support member 3111.

Figure 4:
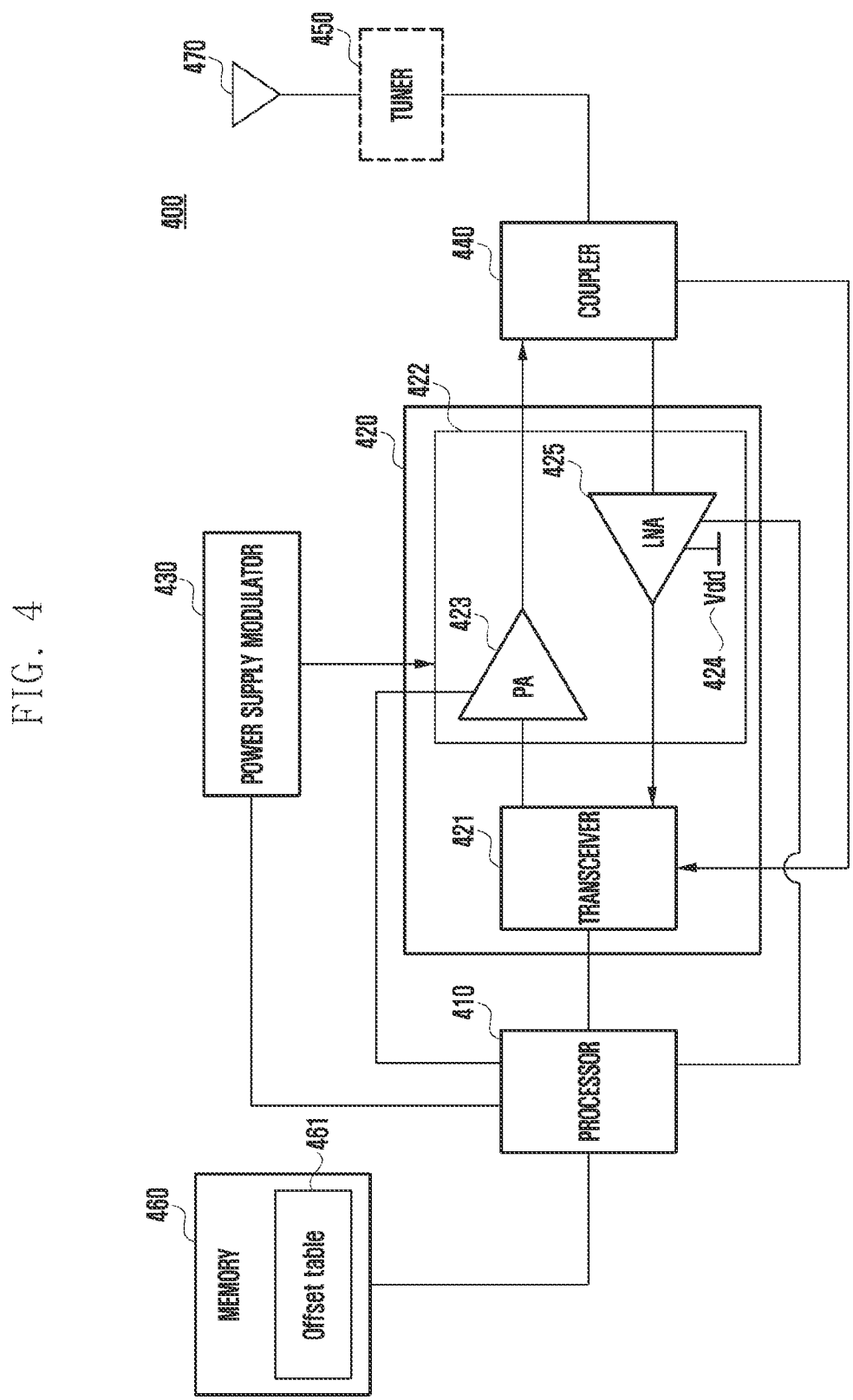
FIG. 4 is a block diagram illustrating an example configuration of an electronic device for efficiently transmitting and receiving RF signals using a power modulator and a tuner according to various embodiments.

FIG. 4 is a block diagram illustrating an example configuration of an electronic device for maintaining the signal quality of an RF signal according to various embodiments.

With reference to FIG. 4, the electronic device 400 according to various embodiments of the disclosure may include, for example, the whole or part of the electronic device 101 shown in FIG. 1 or the electronic device 300 shown in FIGS. 3A and 3B.

The electronic device 400 according to various embodiments of the disclosure may include a processor (e.g., including processing circuitry) 410 (e.g., the processor 120 in FIG. 1), a wireless communication circuit 420 (e.g., the communication module 190 in FIG. 1), a power supply modulator 430, a coupler 440, a tuner 450, a memory 460 (e.g., the memory 130 in FIG. 1), and/or an antenna 470.

According to various embodiments of the disclosure, the processor 410 may include various processing circuitry and control at least one other component of the electronic device 400 electrically connected thereto (e.g., a hardware or software component, the wireless communication circuit 420, the power supply modulator 430, the coupler 440, the tuner 450, and/or the memory 460) and perform various data processing or operations. The processor 410 may include a main processor (e.g., the main processor 121 in FIG. 1) and an auxiliary processor (e.g., the auxiliary processor 123 in FIG. 1), which can be operated independently or together. For example, the main processor may include a central processing unit (CPU) or an application processor (AP). The auxiliary processor may include a communication processor (CP). According to an embodiment, the processor 410 may be the communication processor (CP).

According to various embodiments of the disclosure, the wireless communication circuit 420 may include a transceiver 421 and a front end module (FEM) 422. According to an embodiment, the front end module 422 may include a power amplifier (PA) 423 and/or a low noise amplifier (LNA) 425. According to an embodiment, based on the front end module 422, the processor 410 may support a frequency division duplexing (FDD) scheme and a time division duplexing (TDD) scheme.

According to various embodiments of the disclosure, the transceiver 421 may receive data from the processor 410 and convert the received data into an RF signal (e.g., a transmission (Tx) signal). The transceiver 421 may transmit the converted RF signal to the power amplifier (PA) 423. The converted RF signal (Tx signal) may be amplified through the power amplifier 423, and the amplified RF signal (Tx signal) may be transmitted to another electronic device through the antenna 470. According to an embodiment, the electronic device 400 may receive an RF signal (e.g., a reception (Rx) signal) through the antenna 470, and the received RF signal (Rx signal) may be input to the low noise amplifier 425. The RF signal (Rx signal) may be amplified through the low noise amplifier 425, and the amplified RF signal (Rx signal) may be transmitted to the transceiver 421. The transceiver 421 may convert the amplified RF signal (Rx signal) into readable digital data and transfer it to the processor 410.

According to various embodiments of the disclosure, the power amplifier 423 may amplify an RF signal (e.g., Tx signal) received from the transceiver 421. The power amplifier 423 may receive power from the power supply modulator 430 and, based on a voltage value of the received power, determine an amplification factor of the RF signal (e.g., Tx signal). The amplified RF signal (e.g., Tx signal) may be input to the antenna 470 and transmitted to an external base station through the antenna 470.

According to various embodiments of the disclosure, the low noise amplifier 425 may amplify an RF signal (e.g., Rx signal) received from an external device. For example, the electronic device 400 may receive the RF signal (e.g., Rx signal) through the antenna 470, and the received RF signal (e.g., Rx signal) may be input to the low noise amplifier 425. The low noise amplifier 425 may amplify the received RF signal (e.g., Rx signal) while minimizing and/or reducing noise, and transmit the amplified RF signal to the transceiver 421. According to an embodiment, the low noise amplifier 425 may receive a drain voltage (Vdd) 424 and amplify the RF signal.

According to an embodiment, the power amplifier 423 may receive a collector voltage (e.g., Vcc, voltage of common collector) through the power supply modulator 430. According to an embodiment, the low noise amplifier 425 may receive the drain voltage 424 (e.g., Vdd, voltage of drain), and the drain voltage 424 may be a constant voltage. According to an embodiment, the amplification factor of the power amplifier 423 may be determined based on a voltage value of the power (e.g., collector voltage) supplied from the power supply modulator 430.

According to an embodiment, the voltage value of the power supplied from the power supply modulator 430 may be determined so as to exceed a peak value of the RF signal (e.g., Tx signal) and be close to the peak value. According to an embodiment, in order to increase the efficiency of the power amplifier 423 and the low noise amplifier 425, an average power tracking (APT) technique and/or an envelope tracking (ET) technique may be used. The APT technique and/or the ET technique are techniques for determining the voltage value of power supplied to an amplifier in order to reduce a current leaked by the amplifier. The APT technique and/or the ET technique may reduce a margin between a voltage of an RF signal and a voltage value of power supplied to the amplifier. The APT technique may determine, based on a peak voltage of an RF signal, a specific voltage value close to the peak voltage and constantly supply the determined specific voltage value to the amplifier. The APT technique may determine the specific voltage value of power to be supplied to the amplifier, based on the maximum peak value of the RF signal. The ET technique may continuously change the voltage value of power to be supplied to the amplifier in response to a change in the peak voltage of the RF signal.

According to various embodiments of the disclosure, the power supply modulator 430 may supply power to the power amplifier 423 or the low noise amplifier 425 under the control of the processor 410. Based on the supplied power, the power amplifier 423 or the low noise amplifier 425 may amplify the RF signal. The amplification factor of the RF signal may be determined, based on a voltage value (e.g., Vcc) of the power supplied from the power supply modulator 430. According to an embodiment, the processor 410 may determine the voltage value (Vcc) of the power supplied to the power amplifier 423, based on the peak value of the RF signal. According to an embodiment, the processor 410 may determine the voltage value (Vcc) of the power supplied to the power amplifier 423, based on an offset table 461 stored in the memory 460. According to various embodiments, upon detecting the degradation of the signal quality of the RF signal (Tx signal), the processor 410 may control at least in part the power supply modulator 430 and thereby increase the voltage value of the power to be supplied to the power amplifier 423 by a predetermined magnitude (e.g., a first offset value). According to various embodiments, the processor 410 may maintain the signal quality of the RF signal (e.g., Tx signal, transmission signal, or uplink signal) by adjusting the voltage value of the power to be supplied to the power amplifier 423. For example, before the signal quality is degraded, the processor 410 may maintain the signal quality for the corresponding RF signal.

According to various embodiments of the disclosure, the coupler 440 may be electrically connected between the wireless communication circuit 420 and the antenna 470. The processor 410 may control at least in part the coupler 440 and measure an adjacent channel leakage ratio (ACLR) of an RF signal (e.g., Tx signal) through the coupler 440. For example, from the RF signal (Tx signal) transmitted from the wireless communication circuit 420 to the antenna 470, the processor 410 may extract a coupling signal that maintains a waveform but has lower power than that of the RF signal (Tx signal). The processor 410 may measure the ACLR of the RF signal (Tx signal), based on the extracted coupling signal.

According to various embodiments of the disclosure, the tuner 450 may be disposed and connected between the wireless communication circuit 420 and the antenna 470. According to an embodiment, the tuner 450 may include an impedance tuner. The tuner 450 may be a tuner for antenna matching. Using the tuner 450, the processor 410 may adjust the signal quality of the RF signal. The processor 410 may ensure a linear characteristic of the RF signal using the tuner 450. For example, the tuner 450 may adjust an electrical length (e.g., capacitance, inductance, or resistance) between the antenna 470 and the wireless communication circuit 420. The tuner 450 may minimize and/or reduce a return loss based on an impedance difference between the antenna 470 and the wireless communication circuit 420. According to various embodiments, when the signal quality of the RF signal (e.g., Tx signal) is degraded, the processor 410 may control at least in part the tuner 450 and thereby reduce the signal quality degradation of the RF signal (e.g., Tx signal). According to an embodiment, the tuner 450 may be omitted from the components of the electronic device 400.

According to various embodiments of the disclosure, the memory 460 may store data related to the block error rate (BLER) for an RF signal and/or the adjacent channel leakage ratio (ACLR) for an RF signal. The BLER is a numerical value indicating the linearity of an RF signal (e.g., Tx signal), and when the BLER exceeds about 5%, it may refer, for example, to the linearity of the RF signal being degraded (e.g., the signal quality of the RF signal is degraded). According to an embodiment, the memory 460 may include the offset table 461 and store BLER/ACLR-related data based on the offset table 461. According to various embodiments, the processor 410 may identify a value of one of the BLER or ACLR for the RF signal (e.g., Tx signal) and, based on the offset table 461, determine a voltage value (e.g., Vcc) of the power supplied to the power amplifier 423. The processor 410 may control the power supply modulator 430 to supply the determined power from the power supply modulator 430 to the power amplifier 423.

According to various embodiments of the disclosure, the antenna 470 may transmit or receive an RF signal. According to an embodiment, the processor 410 may transmit an RF signal (e.g., Tx signal) to the base station using the antenna 470 and receive an RF signal (e.g., Rx signal) transmitted from the base station through the antenna 470. According to an embodiment, the antenna 470 may include at least one antenna.

Figure 5A:
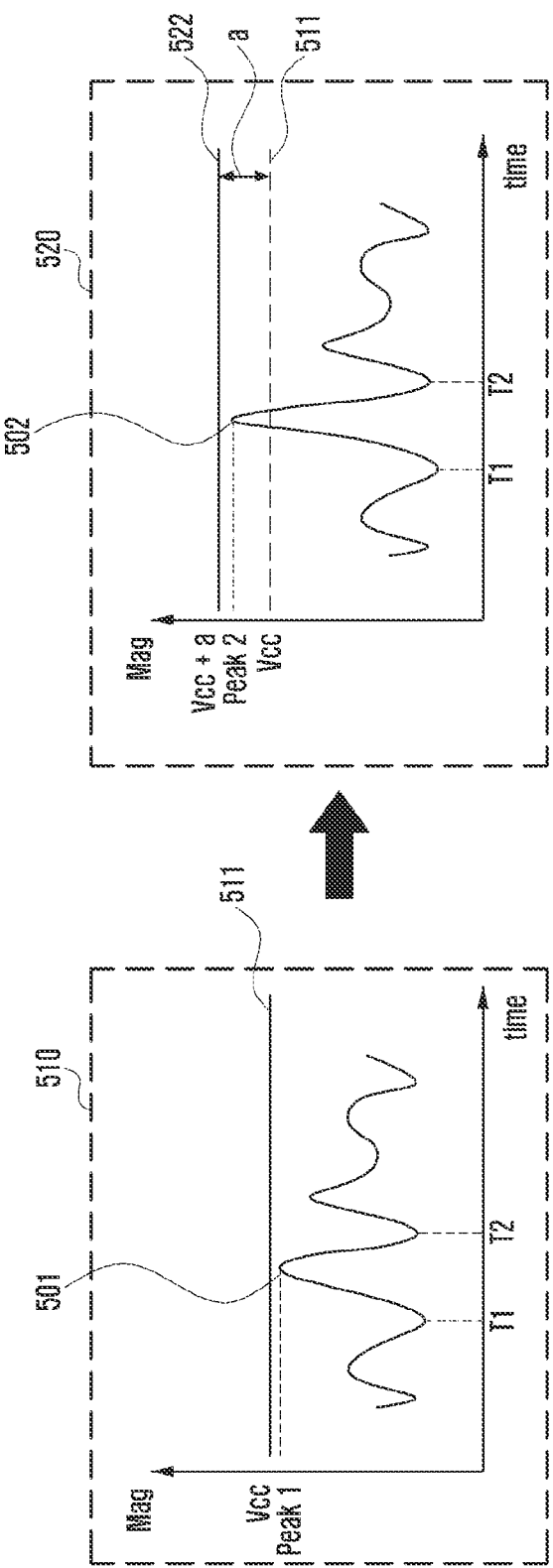
FIG. 5A is a graph illustrating an operation of adjusting a voltage value of power supplied to a power amplifier according to various embodiments.
Figure 5B:
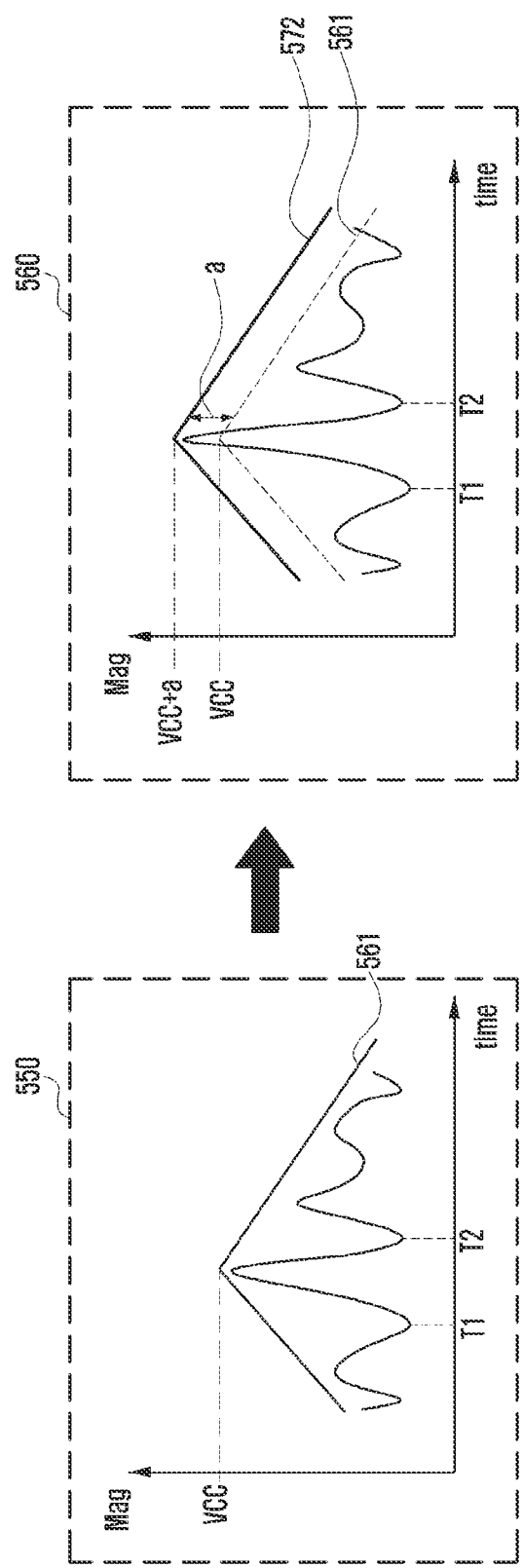
FIG. 5B is a graph illustrating an operation of adjusting a voltage value of power supplied to a power amplifier according to various embodiments.

FIGS. 5A and 5B are graphs illustrating an example operation of adjusting a voltage value of power supplied to a power amplifier according to various embodiments.

In FIG. 5A, a first graph 510 and a second graph 520 are graphs showing the voltage value (Vcc) of power supplied to a power amplifier (e.g., the power amplifier 423 in FIG. 4) based on the average power tracking (APT) technique. Various embodiments of the disclosure are not limited to the APT technique, and the voltage value (Vcc) of the power supplied to the power amplifier 423 may be determined based on the envelope tracking (ET) technique.

The first graph 510 of FIG. 5A is a graph in which the voltage value (Vcc) of the power supplied to the power amplifier 423 is supplied with a constant magnitude. The processor (e.g., the processor 410 in FIG. 4) may control the power supply modulator (e.g., the power supply modulator 430 in FIG. 4) and thereby determine the voltage value (Vcc) 511 of the power supplied to the power amplifier 423. According to an embodiment, the processor 410 may identify a maximum peak value (e.g., a peak voltage value, peak 1) 501 of an RF signal (e.g., Tx signal) and, based on the identified maximum peak value 501, determine the voltage value (Vcc) 511 of the power supplied to the power amplifier 423. According to an embodiment, the voltage value (Vcc) 511 of the power supplied to the power amplifier 423 may be determined so as to be close to the maximum peak value 501 of the RF signal while exceeding the maximum peak value 501. In order to efficiently use power, the processor 410 may determine the voltage value (Vcc) 511 based on the maximum peak value 501.

According to an embodiment, when the voltage value of the power supplied to the power amplifier is lower than the maximum peak value of the RF signal, the linearity of the RF signal may be deteriorated. For example, the signal quality of the RF signal may be degraded. According to an embodiment, a margin between the voltage value of the power supplied to the power amplifier and the maximum peak value of the RF signal (e.g., a difference between the voltage value (Vcc) 511 and the maximum peak value 501) is large, the amount of leakage current may increase. Due to this, the efficiency of power usage for the RF signal may be lowered. According to an embodiment, the processor 410 may determine the voltage value of the power supplied to the power amplifier by reducing the margin for the maximum peak value of the RF signal while exceeding the maximum peak value of the RF signal. According to an embodiment, the processor 410 may reduce the amount of leakage current by reducing the margin for the maximum peak value of the RF signal.

The second graph 520 of FIG. 5A is a graph in which the voltage value (Vcc) of the power supplied to the power amplifier 423 is increased by a certain magnitude (a). The processor 410 may control the power supply modulator 430 and thereby determine a voltage value (Vcc+a) 522 of power supplied to the power amplifier 423. For example, the processor 410 may transmit an RF signal to an external device while the first voltage value (Vcc) 511 is supplied to the power amplifier 423. The RF signal may be reflected by a nearby object (e.g., another antenna), and at least part of the RF signal may generate a reflected wave. According to an embodiment, the generated reflected wave may be introduced into an output terminal of the power amplifier 423, thereby increasing the maximum peak value of the RF signal. For example, the peak value of the RF signal may increase from the first peak value (peak 1) 501 to the second peak value (peak 2) 502. When the peak value of the RF signal exceeds the first voltage value (Vcc) 511 of the power supplied to the power amplifier 423, the linearity of the RF signal may be deteriorated, and the signal quality of the RF signal may be degraded.

According to various embodiments, the processor 410 may identify the signal quality of an RF signal and, when the signal quality of the RF signal satisfies a specified condition, adjust the voltage value of power supplied from the power supply modulator 430 to the power amplifier 423. According to an embodiment, the RF signal may include an uplink signal (e.g., Tx signal) and a downlink signal (e.g., Rx signal). According to an embodiment, the specified condition for the RF signal may be a condition that the signal quality of the uplink signal is degraded in a situation where the signal quality of the downlink signal is maintained. For example, when the uplink signal is transmitted to an external device, at least part of the uplink signal may be reflected by objects located nearby, and a reflected wave of the uplink signal may be generated. According to an embodiment, the uplink signal may have a peak value (e.g., the second peak value (peak 2) 502) increased by the reflected wave, and the signal quality of the uplink signal may be degraded due to the increase of the peak value. According to an embodiment, when the specified condition (e.g., the condition that the signal quality of the downlink signal is maintained and the signal quality of the uplink signal is degraded) is satisfied, the processor 410 may change the voltage value of power supplied to the power amplifier 423 from the first voltage value (Vcc) 511 to the second voltage value (Vcc+a) 522 in relation to the uplink signal. According to an embodiment, when the peak value of the uplink signal increases from the first peak value (peak 1) 501 to the second peak value (peak 2) 502, the processor 410 may increase the power supplied to the power amplifier 423 from the first voltage value (Vcc) 511 to the second voltage value (Vcc+a) 522. According to an embodiment, the processor 410 may increase the voltage value of the power supplied to the power amplifier 423 from the first voltage value (Vcc) 511 to the second voltage value (Vcc+a) 522 by an increase (a) of the peak value.

According to an embodiment, when the specified condition is satisfied in a time interval T1-T2 shown in the second graph 520 of FIG. 5A, the processor 410 may change the voltage value of the power supplied to the power amplifier 423 from the first voltage value (Vcc) 511 to the second voltage value (Vcc+a) 522. For example, if the specified condition is satisfied in a state where the first voltage value (Vcc) 511 is supplied to the power amplifier 423, the processor 410 may increase the first voltage value (Vcc) 511 to the second voltage value (Vcc+a) 522.

In FIG. 5B, a first graph 550 and a second graph 560 are graphs showing the voltage value (Vcc) of power supplied to the power amplifier 423 based on the envelope tracking (ET) technique.

The first graph 550 of FIG. 5B is a graph in which the voltage value of the power supplied to the power amplifier 423 is changed. The processor 410 may identify at least one peak value for an RF signal and determine a voltage value (Vcc) 561 of power supplied to the power amplifier 423 in response to the identified at least one peak value. For example, the processor 410 may identify at least one peak value of the RF signal and change the voltage value (Vcc) 561 of the power supplied to the power amplifier 423, based on the identified at least one peak value.

According to an embodiment, the processor 410 may identify the voltage value of an RF signal (e.g., Tx signal) and, based on the identified voltage value, determine the voltage value 561 of the power supplied to the power amplifier 423. According to an embodiment, the voltage value (Vcc) 561 of the power supplied to the power amplifier 423 may be determined so as to be close to the voltage value of the RF signal while exceeding the voltage value of the RF signal. In order to efficiently use power, the processor 410 may determine the voltage value (Vcc) 561 of the power supplied to the power amplifier 423, based on at least one peak value of the RF signal. According to an embodiment, the processor 410 may minimize and/or reduce the amount of leakage current by reducing a margin for the at least one peak value of the RF signal.

The second graph 520 of FIG. 5B is a graph in which the voltage value (Vcc) of the power supplied to the power amplifier 423 is changed according to a predetermined condition. The processor 410 may control the power supply modulator 430 and thereby determine a voltage value (Vcc+a) 572 of power supplied to the power amplifier 423. For example, based on the ET technique, the processor 410 may transmit an RF signal to an external device while the first voltage value (Vcc) 561 is supplied from the power supply modulator 423 to the power amplifier 423. The RF signal may be reflected by a nearby object (e.g., another antenna), and at least part of the RF signal may generate a reflected wave. According to an embodiment, the generated reflected wave may be introduced into an output terminal of the power amplifier 423, and the voltage value of the RF signal may increase from the first peak value to the second peak value. According to an embodiment, when the voltage value of the RF signal exceeds the voltage value of the power supplied to the power amplifier 423, the linearity of the RF signal may be deteriorated, and the signal quality of the RF signal may be degraded.

According to various embodiments, the processor 410 may identify the signal quality of an RF signal and, when the signal quality of the RF signal satisfies a specified condition, adjust the voltage value of power supplied from the power supply modulator 430 to the power amplifier 423. According to an embodiment, the RF signal may include an uplink signal (e.g., Tx signal) and a downlink signal (e.g., Rx signal). According to an embodiment, the specified condition for the RF signal may be a condition that the signal quality of the uplink signal is degraded in a situation where the signal quality of the downlink signal is maintained. For example, when the uplink signal is transmitted to an external device, at least part of the uplink signal may be reflected by objects located nearby, and a reflected wave of the uplink signal may be generated. According to an embodiment, the uplink signal may have a peak value increased by the reflected wave, and the signal quality of the uplink signal may be degraded due to the increase of the peak value. According to an embodiment, when the specified condition (e.g., the condition that the signal quality of the downlink signal is maintained and the signal quality of the uplink signal is degraded) is satisfied, the processor 410 may change the voltage value of power supplied to the power amplifier 423 from the first voltage value (Vcc) 561 to the second voltage value (Vcc+a) 572 in relation to the uplink signal. According to an embodiment, when the peak value of the uplink signal increases from the first peak value to the second peak value, the processor 410 may increase the power supplied to the power amplifier 423 from the first voltage value (Vcc) 561 to the second voltage value (Vcc+a) 572. The processor 410 may increase the power supplied to the power amplifier 423 by a difference value (a) between the first peak value and the second peak value.

According to an embodiment, when the specified condition is satisfied in a time interval T1-T2 shown in the second graph 560 of FIG. 5B, the processor 410 may change the voltage value of the power supplied to the power amplifier 423 from the first voltage value (Vcc) 561 to the second voltage value (Vcc+a) 572. For example, if the specified condition is satisfied in a state where the first voltage value (Vcc) 561 is supplied to the power amplifier 423, the processor 410 may increase the first voltage value (Vcc) 561 to the second voltage value (Vcc+a) 572.

Figure 6:
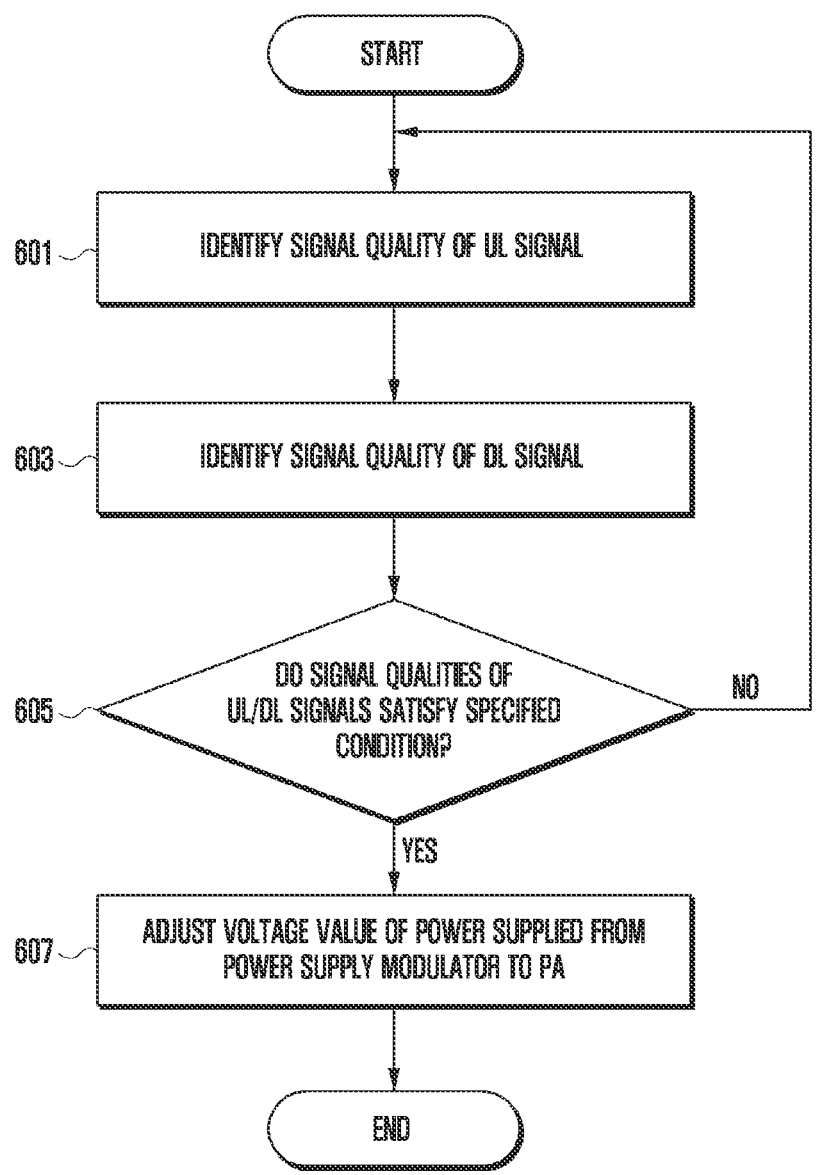
FIG. 6 is a flowchart illustrating an example method for maintaining the signal quality of an uplink (UL) signal (Tx signal) according to various embodiments.

FIG. 6 is a flowchart illustrating an example method for maintaining the signal quality of an uplink (UL) signal (Tx signal) according to various embodiments.

With reference to FIG. 6, at operation 601, a processor (e.g., the processor 410 in FIG. 4) of an electronic device (e.g., the electronic device 400 in FIG. 4) may identify the signal quality of an uplink (UL) signal (e.g., a Tx signal, a transmission signal). According to an embodiment, the processor 410 may identify a BLER or ACLR for the uplink signal (e.g., Tx signal) and, based on the identified BLER or ACLR, identify the signal quality of the uplink signal (e.g., Tx signal). According to an embodiment, measurement data representing the signal quality is not limited to the BLER and the ACLR.

At operation 603, the processor 410 may identify the signal quality of a downlink (DL) signal (e.g., an Rx signal, a reception signal). For example, the processor 410 may detect linearity for the downlink signal (e.g., Rx signal) and, based on the linearity of the downlink signal, identify the signal quality. For example, if the linearity of the downlink signal is not deteriorated, the processor 410 may determine that the reception state of the downlink signal (e.g., Rx signal) is good.

According to an embodiment, in a state where a wireless communication state is a medium electric field state or a strong electric field state, the processor 410 may determine whether the signal quality of the uplink signal (e.g., Tx signal) or the downlink signal (e.g., Rx signal) is good.

With reference to the operations 601 and 603, the processor 410 may identify the signal quality of the uplink signal (Tx signal) and the signal quality of the downlink signal (Rx signal). The processor 410 may determine whether the reception states of the uplink signal and the downlink signal are good. According to an embodiment, the operations 601 and 603 are not limited in order and may be performed simultaneously.

At operation 605, the processor 410 may determine whether the signal qualities of the uplink signal (e.g., Tx signal) and the downlink signal (e.g., Rx signal) satisfy a specified condition. According to an embodiment, the specified condition may be a condition that a communication state for the downlink signal (e.g., Rx signal) is good and a communication state for the uplink signal (e.g., Tx signal) is poor.

According to an embodiment, the processor 410 may identify the signal quality (e.g., BLER, ACLR) of the uplink signal (e.g., Tx signal) and determine that the communication state of the uplink signal (e.g., Tx signal) is deteriorated. For example, if the BLER of the uplink signal (e.g., Tx signal) exceeds about 5%, it may refer, for example, to the signal quality of the uplink signal (e.g., Tx signal) being degraded. A case where the communication state of the uplink signal is not good may be a first state, and a case where the communication state of the uplink signal is good may be a second state.

According to an embodiment, the processor 410 may identify the linearity of the downlink signal (e.g., Rx signal) and determine that the communication state of the downlink signal (e.g., Rx signal) is good. A case where the communication state of the downlink signal is good may be the first state, and a case where the communication state of the downlink signal is not good may be the second state.

According to an embodiment, the specified condition may be a condition that the uplink signal is in the first state (e.g., the signal quality of the uplink signal is degraded) and the downlink signal is in the first state (e.g., the signal quality of the downlink signal is good).

At operation 607, the processor 410 may adjust a voltage value (Vcc) of power supplied from a power supply modulator (e.g., the power supply modulator 430 in FIG. 4) to a power amplifier (e.g., the power amplifier (PA) 423 in FIG. 4). According to an embodiment, the processor 410 may increase the voltage value of the power supplied to the power amplifier (PA) 423 so that the signal quality of the uplink signal (e.g., Tx signal) is not degraded. According to an embodiment, the processor 410 may identify a first offset value for increasing the voltage value of the power, based on an offset table (e.g., the offset table 461 in FIG. 4) stored in a memory (e.g., the memory 460 in FIG. 4). For example, the first offset value may be determined based on BLER and ACLR values of the uplink signal. The first offset value may be included in the offset table 461. According to an embodiment, the processor 410 may increase the voltage value of the power supplied to the power amplifier (PA) 423 by the identified first offset value. The processor 410 may control the power supply modulator 430 to increase the voltage value of the power supplied to the power amplifier 423 by the first offset value.

Figure 7:
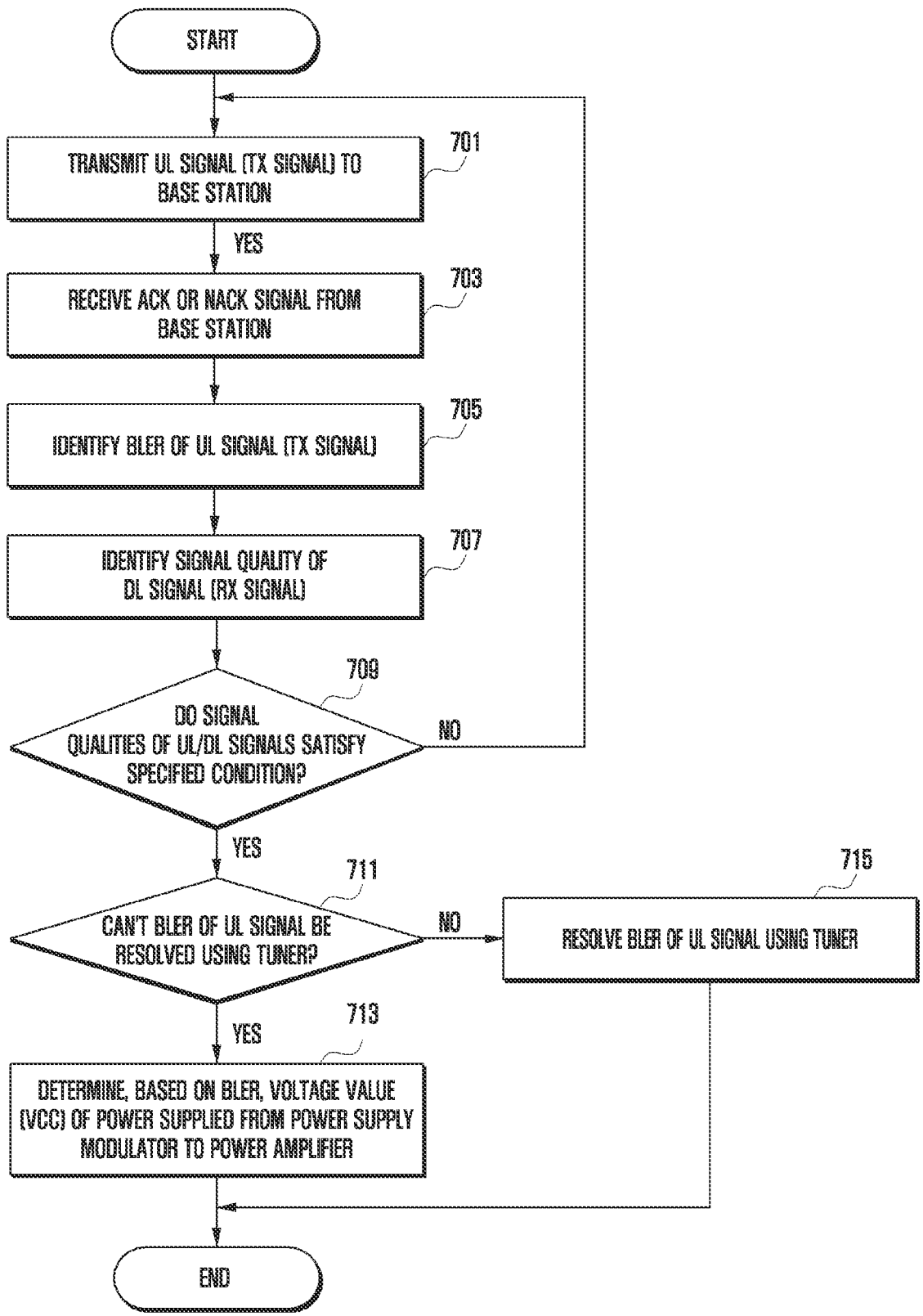
FIG. 7 is a flowchart illustrating an example method for maintaining the signal quality of an uplink signal (Tx signal) based on a block error rate (BLER) for the uplink signal (Tx signal) according to various embodiments.

FIG. 7 is a flowchart illustrating an example method for maintaining the signal quality of an uplink signal (Tx signal) based on a block error rate (BLER) for the uplink signal (Tx signal) according to various embodiments.

With reference to FIG. 7, the signal quality of an uplink signal (e.g., a first signal, a Tx signal) may be identified at operations 701, 703 and 705, and the signal quality of a downlink signal (e.g., a second signal, an Rx signal) may be identified at operation 707.

At operation 701, a processor (e.g., the processor 410 in FIG. 4) of an electronic device (e.g., the electronic device 400 in FIG. 4) may transmit the uplink signal (e.g., Tx signal) to another electronic device (e.g., a base station) through an antenna (e.g., the antenna 470 in FIG. 4). For example, the electronic device 400 and another electronic device may be in a state of performing wireless communication. According to an embodiment, the processor 410 may control a transceiver (e.g., the transceiver 421 in FIG. 4) to generate the uplink signal (e.g., first signal, Tx signal). The transceiver 421 may be electrically connected to a power amplifier (e.g., the power amplifier 423 in FIG. 4). The processor 410 may control a power supply modulator (e.g., the power supply modulator 430 in FIG. 4) to supply power (Vcc) to the power amplifier 423. According to an embodiment, the uplink signal (e.g., first signal, Tx signal) may be amplified through the power amplifier 423, based on the power (Vcc) supplied to the power amplifier 423. The processor 410 may transmit the amplified uplink signal to the base station.

At operation 703, the processor 410 may receive an acknowledge (ACK) signal or a negative acknowledge (NACK) signal for the transmitted uplink signal from the base station. For example, the ACK signal or the NACK signal may include a response signal corresponding to the uplink signal (Tx signal). The ACK signal may be a signal indicating that the uplink signal (Tx signal) has been normally received by the base station. The NACK signal may be a signal requesting a re-signal because the uplink signal has not been normally received at least in part by the base station.

At operation 705, the processor 410 may identify a block error rate (BLER) for the uplink signal, based on the received ACK signal or NACK signal. According to an embodiment, the base station may measure the BLER for the uplink signal and transmit the measured BLER to the electronic device 400 by adding it in the ACK signal or NACK signal. Based on the received ACK signal or NACK signal, the processor 410 may identify the BLER for the uplink signal. According to another embodiment, the processor 410 may calculate the BLER for the uplink signal, based on the ACK signal or NACK signal received from the base station. The BLER may be a numerical value indicating the ratio of error occurring blocks to all transmitted blocks. The BLER may be a percent value, and a large BLER may refer, for example, to the signal quality of the uplink signal (e.g., first signal, Tx signal) being degraded. For example, the degradation of the signal quality of the uplink signal may refer, for example, to the linearity of the power amplifier 423 having been deteriorated. According to an embodiment, the processor 410 may identify the BLER for the uplink signal and, if the identified BLER exceeds about 5%, determine that the signal quality of the uplink signal is degraded. The value of the BLER for determining that the wireless communication performance is degraded may be set variously.

According to various embodiments, when the uplink signal is transmitted to the base station, the uplink signal may be reflected by an object (e.g., an antenna, a thing, and/or a conductive member) located nearby, and a reflected wave may be generated. According to an embodiment, the generated reflected wave may be introduced into the power amplifier 423 of the electronic device 400 and affect the peak voltage of the uplink signal. For example, the peak voltage of the uplink signal may increase due to the reflected wave, and the peak voltage may exceed the voltage value (Vcc) of power supplied to the power amplifier 423. When the peak voltage of the uplink signal exceeds the voltage value (Vcc), the linearity of the uplink signal may be deteriorated. The deterioration of the linearity of the uplink signal may refer, for example, to the performance of wireless communication being lowered and that the signal quality of the uplink signal being degraded. According to various embodiments, the processor 410 may identify the BLER for the uplink signal and, based on the identified BLER, check whether the signal quality of the uplink signal is degraded.

At operation 707, the processor 410 of the electronic device 400 may identify signal quality of the DL signal (e.g Rx signal) to check whether a reception state of a downlink signal (e.g., second signal, Rx signal) is good. According to an embodiment, the processor 410 may identify whether the reception state of the downlink signal (e.g., second signal, Rx signal) is good, for example, whether the signal quality of the downlink signal is degraded. For example, the processor 410 may identify an electric field condition through the downlink signal, and if the electric field is good, the processor 410 may identify whether the linearity of the uplink signal is deteriorated. According to an embodiment, if the downlink signal is good and only the uplink signal quality is deteriorated, the processor 410 may determine that the uplink signal is deteriorated due to the surrounding situations.

At operation 709, the processor 410 may determine whether the uplink signal (e.g., first signal, Tx signal) and the downlink signal (e.g., second signal, Rx signal) satisfy a specified condition. According to an embodiment, the processor 410 may identify an electric field condition (e.g., a weak electric field or a strong electric field) through the downlink signal. For example, the specified condition may be a condition that the BLER for the uplink signal (e.g., Tx signal) exceeds about 5% in a state where a wireless communication state is not the weak electric field (e.g., a good electric field). If the BLER for the uplink signal exceeds about 5%, it may refer, for example, to the signal quality of the wireless communication corresponding to the uplink signal being degraded. According to an embodiment, the specified condition may be a condition that the BLER is greater than about 5% in a state where the signal quality of the downlink signal (e.g., second signal, Rx signal) is maintained and the signal quality of the uplink signal (e.g., first signal, Tx signal) is degraded. For example, the specified condition may include a condition that only the signal quality of the uplink signal is degraded without degradation of the signal quality of the downlink signal in a good electric field. According to an embodiment, the specified condition may be set variously depending on circumstances.

According to an embodiment, the processor 410 may measure a channel environment factor such as a received signal strength indication (RSSI) and, based on the measured channel environment factor, determine a current wireless communication state to be one of a weak electric field, a medium electric field, and/or a strong electric field. For example, the RSSI may be an indicator indicating the strength of a received signal when the signal is received via wireless communication. For example, if the RSSI is about −40 or more, the processor 410 may identify that the current wireless communication state is the strong electric field, and if the RSSI is less than about −90, the processor 410 may identify that the current wireless communication state is the weak electric field. For example, the strong electric field may be in a state of wireless communication near the base station and be in a state where the strength of an RF signal is strong. The weak electric field may be in a state of wireless communication in the basement and be in a state where the strength of an RF signal is weak. According to an embodiment, the specified condition may be a condition premised on the strong electric field or the medium electric field. According to an embodiment, the processor 410 may check whether the uplink signal and the downlink signal satisfy the specified condition in a wireless communication state of the strong electric field or the medium electric field.

If the uplink signal and the downlink signal satisfy the specified condition at the operation 709, the processor 410 may determine at operation 711 whether the identified BLER can be resolved using a tuner (e.g., the tuner 450 in FIG. 4). According to an embodiment, the tuner 450 may be formed between an output port of a wireless communication circuit (e.g., the wireless communication circuit 420 in FIG. 4) and an antenna (e.g., the antenna 470 in FIG. 4). According to an embodiment, resolving the BLER using the tuner 450 may refer, for example, to it being possible to maintain a good signal quality of the uplink signal using the tuner 450. For example, if it is possible to lower the BLER for the uplink signal to be less than about 5% when the BLER for the uplink signal exceeds about 5%, it may be determine at the operation 711 to be able to resolve the BLER for the uplink signal using the tuner 450. According to an embodiment, the tuner 450 may be excluded from the components of the electronic device 400, and when the tuner 450 is excluded, operations 711 and 715 may be omitted.

If it is determined at the operation 711 that the BLER for the uplink signal cannot be resolved using the tuner, the processor 410 may determine at operation 713, based on the identified BLER, a voltage value (Vcc) of power supplied from the power supply modulator 430 to the power amplifier (e.g., the power amplifier 423 in FIG. 4). For example, a larger BLER may refer, for example, to the linearity of the uplink signal being further deteriorated, and an increase in power supplied from the power modulator 430 to the power amplifier 423 may be increased. According to an embodiment, a large BLER may refer, for example, to the peak voltage of the uplink signal being greater than the voltage value of power supplied to the power amplifier 423 and may refer, for example, to the linearity of the uplink signal being deteriorated. According to an embodiment, the processor 410 may determine the voltage value of the power supplied to the power amplifier 423, based on an increase (a) of the peak voltage of the uplink signal. For example, when the peak voltage of the uplink signal is a first peak value, the processor 410 may determine a first voltage value (Vcc) of the power supplied to the power amplifier 423 in response to the first peak value. According to an embodiment, the first voltage value (Vcc) according to the peak voltage is a preset value and may be a value stored in an offset table (e.g., the offset table 461 in FIG. 4) of a memory (e.g., the memory 460 in FIG. 4). When the peak voltage of the uplink signal increases from the first peak value to a second peak value, the processor 410 may determine a second voltage value (Vcc+a) of the power supplied to the power amplifier 423 in response to the second peak value. According to an embodiment, the second voltage value (Vcc+a) may be a value increased by the increment (a) (e.g., the second voltage value minus the first voltage value) of the peak voltage from the first voltage value (Vcc). According to an embodiment, the increment (a) of the peak voltage may be stored in the offset table 461 of the memory 460. According to an embodiment, based on the offset table 461, the processor 410 may load the increment (a) of the peak voltage corresponding to the BLER. According to an embodiment, the processor 410 may determine the increment (a) of the peak voltage, based on the first voltage value (Vcc) and the second voltage value (Vcc+a). According to an embodiment, the voltage value of the power supplied to the power amplifier 423 may be determined to be close to the peak voltage of the uplink signal while exceeding the peak voltage of the uplink signal. According to an embodiment, the processor 410 may use power efficiently by setting the voltage supplied to the power amplifier 423 to be close to the peak voltage.

According to various embodiments, based on the BLER value for the uplink signal and the voltage value of the power supplied from the power supply modulator 430 to the power amplifier 423, the offset table (e.g., the offset table 461 in FIG. 4) may be set. The offset table 461 may be stored in the memory (e.g., the memory 460 in FIG. 4) of the electronic device 400. When the BLER value for the uplink signal is identified, the processor 410 may determine the voltage value of the power supplied from the power supply modulator 430 to the power amplifier 423, based on the offset table 461 stored in the memory 460. According to an embodiment, the offset table 461 may be data in which the voltage value of power to be supplied to the power amplifier 423 is set in response to the BLER value.

According to various embodiments, the processor 410 may determine the voltage value of the power supplied from the power supply modulator 430 to the power amplifier 423 while increasing the voltage value of the power by a predetermined magnitude. For example, the processor 410 may re-identify the BLER for the uplink signal, based on the voltage value increased by the predetermined magnitude. The processor 410 may increase the voltage value again by the predetermined magnitude until the re-identified BLER satisfies a specified condition (e.g., BLER of less than about 5%). According to an embodiment, the processor 410 may supply, to the power amplifier 423, power having a voltage value of a time point when the re-identified BLER satisfies the specified condition.

If it is determined at the operation 711 that the BLER can be resolved using the tuner, the processor 410 may resolve the BLER for the uplink signal using the tuner 450 at operation 715. The processor 410 may maintain good linearity for the uplink signal using the tuner 450. For example, when the BLER is greater than about 5% and if the BLER can be reduced to be less than about 5% using the tuner 450, the processor 410 may adjust the uplink signal to reduce the BLER to be less than about 5% using the tuner 450.

According to an embodiment, the processor 410 may resolve the BLER for the uplink signal by increasing the voltage value of the power supplied to the power amplifier 423 at the operation 713 or using the tuner 450 at the operation 715. According to various embodiments, the processor 410 may detect that the signal quality of the uplink signal is degraded, and then either increase the voltage value of the power supplied to the power amplifier 423 by controlling the power supply modulator 430 or use the tuner 450, thereby preventing and/or reducing the degradation of the signal quality of the uplink signal.

Figure 8:
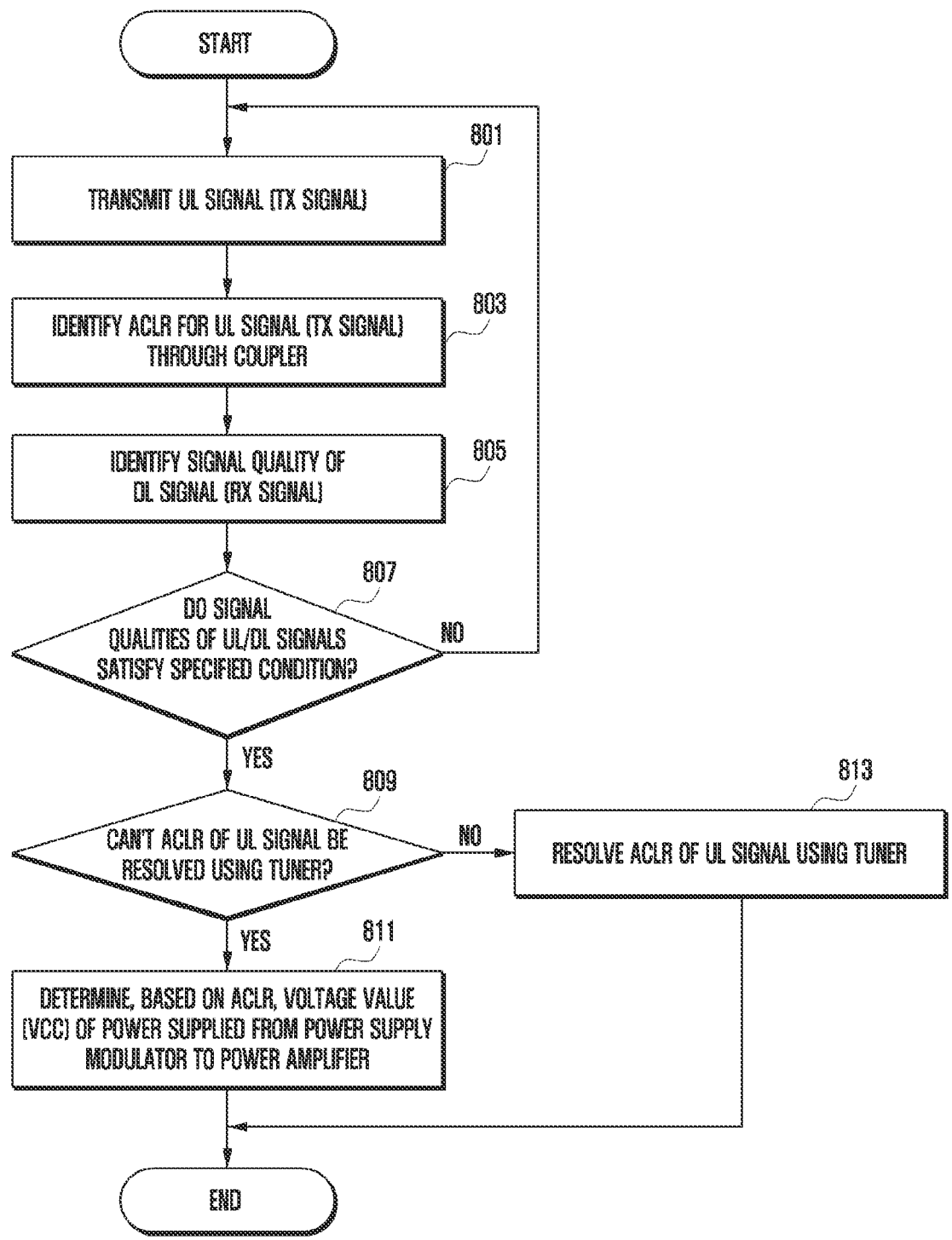
FIG. 8 is a flowchart illustrating an example method for maintaining the signal quality of an uplink signal (Tx signal) based on an adjacent channel leakage ratio (ACLR) for the uplink signal (Tx signal) according to various embodiments.

FIG. 8 is a flowchart illustrating an example method for maintaining the signal quality of an uplink signal (Tx signal) based on an adjacent channel leakage ratio (ACLR) for the uplink signal (Tx signal) according to various embodiments.

With reference to FIG. 8, the signal quality of an uplink signal (e.g., a first signal, a Tx signal) may be identified at operations 801 and 803, and the signal quality of a downlink signal (e.g., a second signal, an Rx signal) may be identified at operation 805.

At operation 801, a processor (e.g., the processor 410 in FIG. 4) of an electronic device (e.g., the electronic device 400 in FIG. 4) may transmit the uplink signal (e.g., Tx signal) to another electronic device (e.g., a base station) through an antenna (e.g., the antenna 470 in FIG. 4). For example, the electronic device 400 and another electronic device may be in a state of performing wireless communication. According to an embodiment, the processor 410 may control a transceiver (e.g., the transceiver 421 in FIG. 4) to generate the uplink signal (e.g., first signal, Tx signal). The transceiver 421 may be electrically connected to a power amplifier (e.g., the power amplifier 423 in FIG. 4). The processor 410 may control a power supply modulator (e.g., the power supply modulator 430 in FIG. 4) to supply power (Vcc) to the power amplifier 423. According to an embodiment, the uplink signal (e.g., first signal, Tx signal) may be amplified through the power amplifier 423, based on the power (Vcc) supplied to the power amplifier 423. The processor 410 may transmit the amplified uplink signal to the base station.

At operation 803, the processor 410 may measure an adjacent channel leakage ratio (ACLR) for the uplink signal (e.g., first signal, Tx signal) through a coupler (e.g., the coupler 440 in FIG. 4). The ACLR may be a barometer of indicating the linearity for the uplink signal. According to an embodiment, the ACLR is a numerical value representing a linear characteristic for the uplink signal and is not construed as a limitation. The value representing the linear characteristic may include the ACLR and/or error vector magnitude (EVM). According to an embodiment, the uplink signal transmitted from the transceiver 421 may be amplified by the power amplifier 423 and then transferred to the antenna 470 through the coupler 440 to be transmitted to the base station. According to an embodiment, the power amplifier 423 may be electrically connected to the coupler 440, and the uplink signal amplified by the power amplifier 423 may be transmitted to the base station through the coupler 440. According to an embodiment, through the coupler 440, the processor 410 may measure the ACLR for the uplink signal amplified by the power amplifier 423. According to an embodiment, the processor 410 may measure the ACLR for the uplink signal in real time. Based on the measured ACLR, the processor 410 may determine whether the linearity of the uplink signal is deteriorated. For example, the deterioration of the linearity of the uplink signal may refer, for example, to the signal quality of the uplink signal (e.g., performance of wireless communication) being degraded.

At operation 805, the processor 410 of the electronic device 400 may identify signal quality of the downlink signal (e.g., Rx signal) to check whether a reception state of a downlink signal (e.g., second signal, Rx signal) is good. According to an embodiment, the processor 410 may identify whether the reception state of the downlink signal (e.g., second signal, Rx signal) is good, for example, whether the signal quality of the downlink signal is degraded. For example, the processor 410 may identify an electric field condition through the downlink signal, and if the electric field is good, the processor 410 may identify whether the linearity of the uplink signal is deteriorated. According to an embodiment, if the downlink signal is good and only the uplink signal quality is deteriorated, the processor 410 may determine that the uplink signal is deteriorated due to the surrounding situations.

At operation 807, the processor 410 may determine whether the qualities of the uplink signal (e.g., first signal, Tx signal) and the downlink signal (e.g., second signal, Rx signal) satisfy a specified condition. For example, the specified condition may be a condition that the ACLR for the uplink signal exceeds a predetermined threshold in a state where the wireless communication state is not a weak electric field. According to an embodiment, the processor 410 may determine whether the measured ACLR exceeds the predetermined threshold. When the measured ACLR exceeds the predetermined threshold, it may refer, for example, to the linearity of the uplink signal being deteriorated, and it may refer, for example, to the signal quality of the uplink signal being degraded. According to an embodiment, the specified condition may be a condition that the ACLR exceeds the predetermined threshold in a state where the signal quality of the downlink signal is maintained and the signal quality of the uplink signal is degraded. According to an embodiment, the specified condition may be set variously depending on circumstances.

According to an embodiment, the processor 410 may measure a channel environment factor such as the RSSI and, based on the measured channel environment factor, determine a current wireless communication state to be one of a weak electric field, a medium electric field, and/or a strong electric field. According to an embodiment, the specified condition may be a condition premised on the strong electric field or the medium electric field. According to an embodiment, the processor 410 may check whether the ACLR for the uplink signal satisfies the specified condition in a wireless communication state of the strong electric field or the medium electric field.

If the uplink signal and the downlink signal satisfy the specified condition at the operation 807, the processor 410 may determine at operation 809 whether the performance degradation of wireless communication can be resolved using the tuner 450. According to an embodiment, the tuner 450 may be formed between an output port of a wireless communication circuit (e.g., the wireless communication circuit 420 in FIG. 4) and an antenna (e.g., the antenna 470 in FIG. 4). According to an embodiment, resolving the performance degradation of wireless communication using the tuner 450 may refer, for example, to it being possible to maintain a good signal quality of the uplink signal using the tuner 450. For example, if it is possible to adjust the ACLR for the uplink signal to be less than the predetermined threshold, it may be determined at the operation 809 that the performance degradation of wireless communication can be resolved using the tuner 450. According to an embodiment, the tuner 450 may be excluded from the components of the electronic device 400, and when the tuner 450 is excluded, operations 809 and 813 may be omitted.

If it is determined at the operation 809 that the performance degradation of wireless communication cannot be resolved using the tuner, the processor 410 may determine at operation 811, based on the identified ACLR, a voltage value (Vcc) of power supplied from the power supply modulator 430 to the power amplifier (e.g., the power amplifier 423 in FIG. 4). For example, a larger ACLR may refer, for example, to the linearity of the uplink signal being further deteriorated, and an increase in power supplied from the power modulator 430 to the power amplifier 423 may be increased. According to an embodiment, a large ACLR may refer, for example, to the peak voltage of the uplink signal being greater than the voltage value of power supplied to the power amplifier 423 and may refer, for example, to the linearity of the uplink signal being deteriorated. According to an embodiment, the processor 410 may determine the voltage value of the power supplied to the power amplifier 423, based on an increase of the peak voltage of the uplink signal. According to an embodiment, the voltage value of the power supplied to the power amplifier 423 may be determined to be close to the peak voltage of the uplink signal while exceeding the peak voltage of the uplink signal. According to an embodiment, the processor 410 may use power efficiently by setting the voltage supplied to the power amplifier 423 to be close to the peak voltage.

According to various embodiments, based on the ACLR value for the uplink signal and the voltage value of the power supplied from the power supply modulator 430 to the power amplifier 423, the offset table (e.g., the offset table 461 in FIG. 4) may be set, and the offset table 461 may be stored in the memory (e.g., the memory 460 in FIG. 4) of the electronic device 400. When the ACLR value for the uplink signal is identified, the processor 410 may determine the voltage value of the power supplied from the power supply modulator 430 to the power amplifier 423, based on the offset table 461 stored in the memory 460.

According to various embodiments, the processor 410 may determine the voltage value of the power supplied from the power supply modulator 430 to the power amplifier 423 while increasing the voltage value of the power by a predetermined magnitude. For example, the processor 410 may re-identify the ACLR for the uplink signal, based on the voltage value increased by the predetermined magnitude. The processor 410 may increase the voltage value again by the predetermined magnitude until the re-identified ACLR satisfies the specified condition. According to an embodiment, the processor 410 may supply, to the power amplifier 423, power having a voltage value of a time point when the re-identified ACLR satisfies the specified condition.

If it is determined at the operation 809 that the performance degradation of wireless communication can be resolved using the tuner, the processor 410 may resolve the performance degradation of wireless communication using the tuner 450 at operation 813. For example, when the ACLR is greater than the predetermined threshold and if the ACLR can be reduced to be less than the predetermined threshold using the tuner 450, the processor 410 may resolve the performance degradation of wireless communication using the tuner 450.

According to an embodiment, the processor 410 may resolve the performance degradation of wireless communication by increasing the voltage value of the power supplied to the power amplifier 423 at the operation 811 or using the tuner 450 at the operation 813. According to various embodiments, the processor 410 may detect that the signal quality of the uplink signal is degraded, and then either increase the voltage value of the power supplied to the power amplifier 423 by controlling the power supply modulator 430 or use the tuner 450, thereby resolving the performance degradation of wireless communication.

According to various embodiments, the base station that performs wireless communication with the electronic device 400 may transmit, to the electronic device 400, a feedback signal (e.g., an ACK signal, a NACK signal) corresponding to an uplink signal received from the electronic device 400. For example, the feedback signal may contain information related to the state of wireless communication between the electronic device 400 and the base station. The feedback signal may contain information for determining whether the performance of wireless communication between the electronic device 400 and the base station has deteriorated. According to an embodiment, the electronic device 400 may receive the feedback signal from the base station and, based on the feedback signal, adjust a voltage value of power supplied to the power amplifier.

An electronic device (e.g., the electronic device 400 in FIG. 4) according to various example embodiments of the disclosure may include: a transceiver (e.g., the transceiver 421 in FIG. 4), a power amplifier (e.g., the power amplifier 423 in FIG. 4) connected to the transceiver, a power supply modulator (e.g., the power supply modulator 430 in FIG. 4) configured to supply power to the power amplifier, at least one antenna (e.g., the antenna 470 in FIG. 4) connected to the power amplifier, and at least one processor (e.g., the processor 410 in FIG. 4) operatively connected to the transceiver, the power amplifier, and the power supply modulator. The at least one processor may be configured to: determine whether a state of an uplink signal transmitted through the at least one antenna is a first state, determine whether a state of a downlink signal received to the transceiver is the first state, and to control the power supply modulator to add a first offset value to a voltage value of power supplied from the power supply modulator to the power amplifier based on the state of the uplink signal being the first state and the state of the downlink signal being the first state.

According to various example embodiments, the first state of the uplink signal may refer to a state in which a signal quality of the uplink signal is degraded, and the first state of the downlink signal may refer to a state in which a signal quality of the downlink signal is good.

According to various example embodiments, the at least one processor may be configured to: receive a response signal corresponding to the uplink signal from a base station, identify a block error rate (BLER) related to a signal quality corresponding to the response signal, check whether the identified BLER exceeds a specific threshold, and determine that the uplink signal is in the first state based on the identified BLER exceeding the specific threshold.

According to various example embodiments, the response signal corresponding to the uplink signal may include at least one of an acknowledge (ACK) signal or a negative acknowledge (NACK) signal.

According to various example embodiments, the at least one processor may be configured to: measure a channel environment factor such as a received signal strength indication (RSSI) indicating a wireless communication state, check based on the measured channel environment factor whether the wireless communication state is one of a strong electric field or a medium electric field, and determine in a state of the strong electric field or the medium electric field whether the state of the uplink signal is the first state.

According to various example embodiments, the electronic device may further include: a coupler (e.g., the coupler 440 in FIG. 4) disposed between the power amplifier and the at least one antenna. The at least one processor may be configured to: identify a linear characteristic including an adjacent channel leakage ratio (ACLR) and/or an error vector magnitude (EVM) for the uplink signal through the coupler, and determine based on the identified linear characteristic for the uplink signal whether the uplink signal is in the first state.

According to various example embodiments, the at least one processor may be configured to: check whether the identified linear characteristic for the uplink signal exceeds a specified threshold, and determine that the uplink signal is in the first state based on the identified linear characteristic exceeding the threshold.

According to various example embodiments, the at least one processor may be configured to: control the power supply modulator to add the first offset value to the voltage value of the power supplied from the power supply modulator to the power amplifier based on the identified linear characteristic exceeding the specified threshold.

According to various example embodiments, the electronic device may further include a memory (e.g., the memory 460 in FIG. 4) storing an offset table (e.g., the offset table 461 in FIG. 4) based on a linear characteristic and BLER related to a signal quality of the uplink signal. The at least one processor may be configured to: determine the first offset value based on the offset table based on the uplink signal being in the first state.

According to various example embodiments, the voltage value of the power supplied to the power amplifier may be determined based on a peak value of the uplink signal.

According to various example embodiments, the at least one processor may be configured to: continuously increase the voltage value of the power supplied from the power supply modulator to the power amplifier, and to determine the voltage value of the power supplied to the power amplifier based on the state of the uplink signal being changed from the first state to a second state.

According to various example embodiments, the second state of the uplink signal may refer to a state in which the signal quality of the uplink signal is good.

An electronic device according to various example embodiments of the disclosure may include: a transceiver, a power amplifier connected to the transceiver, a power supply modulator configured to supply power to the power amplifier, at least one antenna connected to the power amplifier, a tuner disposed between the power amplifier and the at least one antenna, and at least one processor operatively connected to the transceiver, the power amplifier, the power supply modulator, and the tuner. The at least one processor may be configured to: determine whether a state of an uplink signal transmitted through the at least one antenna is a first state, determine whether a state of a downlink signal received to the transceiver is the first state, and based on the state of the uplink signal being the first state and the state of the downlink signal being the first state, check whether the state of the uplink signal is adjustable to a second state using the tuner, and control the tuner to adjust the state of the uplink signal to the second state in response to the state being adjustable.

According to various example embodiments, the first state of the uplink signal may refer to a state in which a signal quality of the uplink signal is degraded, the second state of the uplink signal may refer to a state in which the signal quality of the uplink signal is good, and the first state of the downlink signal may refer to a state in which a signal quality of the downlink signal is good.

A method according to various example embodiments of the disclosure may include: determining whether a state of an uplink signal transmitted through at least one antenna of an electronic device is a first state, determining whether a state of a downlink signal received to a transceiver of the electronic device is the first state, and adding a first offset value to a voltage value of power supplied from a power supply modulator of the electronic device to a power amplifier of the electronic device based on the state of the uplink signal being the first state and the state of the downlink signal being the first state.

According to various example embodiments, the first state of the uplink signal may refer to a state in which a signal quality of the uplink signal is degraded, and the first state of the downlink signal may refer to a state in which a signal quality of the downlink signal is good.

According to various example embodiments, determining whether the state of the uplink signal is the first state may include: receiving a response signal corresponding to the uplink signal from a base station, identifying a block error rate (BLER) related to a signal quality corresponding to the response signal, checking whether the identified BLER exceeds a specific threshold, and determining that the uplink signal is in the first state based on the identified BLER exceeding the specific threshold.

According to various example embodiments, determining whether the state of the uplink signal is the first state may include identifying a linear characteristic including an adjacent channel leakage ratio (ACLR) and/or an error vector magnitude (EVM) for the uplink signal through a coupler of the electronic device, and determining based on the identified linear characteristic for the uplink signal whether the uplink signal is in the first state.

The method according to various example embodiments may further include: measuring a channel environment factor such as a received signal strength indication (RSSI) indicating a wireless communication state, and checking based on the measured channel environment factor whether the wireless communication state is one of a strong electric field or a medium electric field.

The method according to various example embodiments may further include, when the state of the uplink signal is the first state and the state of the downlink signal is the first state, checking whether the state of the uplink signal is adjustable to a second state using a tuner, and controlling the tuner to adjust the state of the uplink signal to the second state in response to the state being adjustable.

The embodiments of the disclosure disclosed herein and the drawings simply present a specific example in order to easily describe the technical contents according to various example embodiments of the disclosure and to aid in an understanding of the disclosure, and they are not intended to limit the scope of the disclosure. Accordingly, all changes or modifications derived from the technical idea of various embodiments of the disclosure in addition to the embodiments described herein should be construed as being included in the scope of the disclosure without departing from the scope of the disclosure. It will also be understood that any of the embodiment(s) described herein may be used in conjunction with any other embodiment(s) described herein.

What is claimed is:

1. An electronic device comprising:
a transceiver;
a power amplifier (PA) connected to the transceiver;
a power supply modulator configured to supply power to the power amplifier;
at least one antenna connected to the power amplifier; and
at least one processor, comprising processing circuitry, operatively connected to the transceiver, the power amplifier, and the power supply modulator, and configured to:
identify a block error rate (BLER) corresponding to an uplink signal transmitted through the at least one antenna,
determine whether a signal quality of the uplink signal is a degraded state based on the identified BLER,
measure a channel environment factor including a received signal strength indication (RSSI) indicating a wireless communication state,
identify whether the wireless communication state is one of a strong electric field or a medium electric field based on the measured channel environment factor,
determine whether a signal quality of a downlink signal received at the transceiver is a good state based on the strong electric field and/or the medium electric field, and control the power supply modulator to add a first offset value to a voltage value of power supplied from the power supply modulator to the power amplifier based on the signal quality of the uplink signal being the degraded state and the signal quality of the downlink signal being the good state.

2. The electronic device of claim 1, wherein the at least one processor is configured to:
receive a response signal corresponding to the uplink signal from a base station, identify the BLER related to a signal quality corresponding to the response signal, check whether the identified BLER exceeds a specific threshold, and determine that the uplink signal is in the degraded state based on the identified BLER exceeding the specific threshold.

3. The electronic device of claim 2, wherein the response signal corresponding to the uplink signal includes at least one of an acknowledge (ACK) signal or a negative acknowledge (NACK) signal.

4. The electronic device of claim 1, further comprising:
a coupler disposed between the power amplifier and the at least one antenna,
wherein the at least one processor is configured to:
identify a linear characteristic including an adjacent channel leakage ratio (ACLR) or an error vector magnitude (EVM) for the uplink signal through the coupler, and determine based on the identified linear characteristic for the uplink signal whether the uplink signal is in the degraded state.

5. The electronic device of claim 4, wherein the at least one processor is configured to:
check whether the identified linear characteristic for the uplink signal exceeds a specified threshold, and determine that the uplink signal is in the degraded state based on the identified linear characteristic exceeding the threshold.

6. The electronic device of claim 5, wherein the at least one processor is configured to:
control the power supply modulator to add the first offset value to the voltage value of the power supplied from the power supply modulator to the power amplifier based on the identified linear characteristic exceeding the specified threshold.

7. The electronic device of claim 1, further comprising:
a memory storing an offset table formed based on a linear characteristic and BLER related to a signal quality of the uplink signal,
wherein the at least one processor is configured to:
determine the first offset value based on the offset table based on the uplink signal being in the degraded state.

8. The electronic device of claim 1, wherein the voltage value of the power supplied from the power amplifier is determined based on a peak value of the uplink signal.

9. The electronic device of claim 1, wherein the at least one processor is configured to:
continuously increase the voltage value of the power supplied from the power supply modulator to the power amplifier, and
determine the voltage value of the power supplied to the power amplifier based on the signal quality of the uplink signal being changed from the degraded state to a good state.

10. The electronic device of claim 9, wherein the good state of the uplink signal is a state in which the signal quality of the uplink signal is good.

11. The electronic device of claim 1, further comprising:
a tuner disposed between the power amplifier and the at least one antenna,
wherein the at least one processor is configured to:
based on the signal quality of the uplink signal being the degraded state and the signal quality of the downlink signal being the good state, check whether the signal quality of the uplink signal is adjustable to a good state using the tuner, and control the tuner to adjust the signal quality of the uplink signal to the good state in response to the signal quality being adjustable.

12. The electronic device of claim 11, wherein the degraded state of the uplink signal is a state in which a signal quality of the uplink signal is degraded, the good state of the uplink signal is a state in which the signal quality of the uplink signal is good, and the good state of the downlink signal is a state in which a signal quality of the downlink signal is good.

13. A method comprising:
   identifying a block error rate (BLER) corresponding to an uplink signal transmitted through at least one antenna of an electronic device;
   determining whether a signal quality of an uplink signal transmitted through at least one antenna of an electronic device is a degraded state based on the identified BLER;
   measuring a channel environment factor including a received signal strength indication (RSSI) indicating a wireless communication state;
   identifying whether the wireless communication state is a strong electric field and/or a medium electric field based on the measured channel environment factor;
   determining whether a signal quality of a downlink signal received at a transceiver of the electronic device is a good state based on the strong electric field and/or the medium electric field; and
   adding a first offset value to a voltage value of power supplied from a power supply modulator of the electronic device to a power amplifier of the electronic device based on the signal quality of the uplink signal being the degraded state and the signal quality of the downlink signal being the good state.

14. The method of claim 13, wherein determining whether the signal quality of the uplink signal is the degraded state includes:
   receiving a response signal corresponding to the uplink signal from a base station;
   identifying the BLER related to a signal quality corresponding to the response signal;
   checking whether the identified BLER exceeds a specific threshold; and
   determining that the uplink signal is in the degraded state based on the identified BLER exceeding the specific threshold.

15. The method of claim 13, wherein determining whether the state of the uplink signal is the degraded state includes:
   identifying a linear characteristic including an adjacent channel leakage ratio (ACLR) or an error vector magnitude (EVM) for the uplink signal through a coupler of the electronic device; and
   determining based on the identified linear characteristic for the uplink signal whether the uplink signal is in the degraded state.

16. The method of claim 13, further comprising:
   based on the signal quality of the uplink signal being the degraded state and the signal quality of the downlink signal being the good state, checking whether the signal quality of the uplink signal is adjustable to a good state using a tuner; and
   controlling the tuner to adjust the signal quality of the uplink signal to the good state in response to the signal quality being adjustable.

* * * * *